(12) United States Patent
Katti et al.

(10) Patent No.: US 9,368,179 B2
(45) Date of Patent: Jun. 14, 2016

(54) MAGNETIC FIELD SENSING USING MAGNETORESISTIVE RANDOM ACCESS MEMORY (MRAM) CELLS

(71) Applicant: Honeywell International Inc., Morristown, NJ (US)

(72) Inventors: Romney R. Katti, Shorewood, MN (US); Michael A. Smith, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/500,334

(22) Filed: Sep. 29, 2014

(65) Prior Publication Data

US 2015/0016184 A1   Jan. 15, 2015

Related U.S. Application Data

(63) Continuation of application No. 13/561,478, filed on Jul. 30, 2012, now Pat. No. 8,848,431.

(51) Int. Cl.
| | | |
|---|---|---|
| *G11C 11/00* | (2006.01) | |
| *G11C 11/16* | (2006.01) | |
| *G11C 29/04* | (2006.01) | |

(52) U.S. Cl.
CPC ............ *G11C 11/1675* (2013.01); *G11C 11/16* (2013.01); *G11C 29/04* (2013.01)

(58) Field of Classification Search
CPC ...... G11C 11/16; G11C 11/15; G11C 11/161; G11B 5/1278; G11B 5/39; G11B 33/1493; G11B 5/3906; G11B 5/3909

USPC ......... 365/158, 171, 173, 148, 157, 209, 213, 365/97
See application file for complete search history.

(56) References Cited

U.S. PATENT DOCUMENTS

| | | | |
|---|---|---|---|
| 7,239,543 | B2 | 7/2007 | Chung et al. |
| 7,791,937 | B2 | 9/2010 | Jedema et al. |
| 2009/0273967 | A1* | 11/2009 | Schroegmeier ........ G11C 11/16 365/158 |
| 2011/0210410 | A1 | 9/2011 | Ding et al. |

OTHER PUBLICATIONS

"1-Axis Magnetic Sensor HMC1041Z," Honeywell International, Inc., Apr. 2005, 6 pp.

(Continued)

*Primary Examiner* — Thong Q Le
(74) *Attorney, Agent, or Firm* — Shumaker & Sieffert, P.A.

(57) ABSTRACT

A magnetic field sensing system includes one or more magnetoresistive random access memory (MRAM) cells, and may be configured to determine one or more of a presence, a magnitude, and a polarity of an external magnetic field incident upon an MRAM cell. In some examples, a control module of the system controls a write current source, or another device, to provide a write current through a write line associated with the MRAM cell to induce a magnetic field proximate to the MRAM cell. The magnetic field may be less than a magnetic switching threshold of the MRAM cell. After initiating the provision of the write current through the write line, the control module may determine a magnetic state of the MRAM cell, and determine a presence of an external magnetic field incident upon the MRAM cell based at least in part on the magnetic state of the MRAM cell.

20 Claims, 10 Drawing Sheets

(56) References Cited

OTHER PUBLICATIONS

Albon, "Integration of Tunneling Magnetoresistive Sensors for High Resolutive Magnetic Particle Detection," PhD thesis in physics, Department of Physics, Bielefeld University, Nov. 2009, 128 pp.

Dimitropoulos et al., "A 2-D Ferrous Object Imaging Technique Based on Magnetic Field Sensor Arrays," Sensors and Actuators A: Physical, vol. 106, No. 1-3, Sep. 15, 2003, 4 pp.

"Three-Axis, Digital Magnetometer," Freescale Semicondutor, Inc., Data Sheet: Advance Information, Document No. MAG3110, Rev. 7, Oct. 2011, 25 pp.

Freitas et al., "Magnetoresistive Sensors," Journal of Physics: Condensed Matter, vol. 19, No. 16, Apr. 23, 2007, 21 pp.

Knauss et al., "Current Imaging Using Magnetic Field Sensors," Microelectronics Failure Analysis, vol. 1, ASM International, Jan. 1, 2004, 9 pp.

Stanley, "Magnetic Sensor Makes Electronic Compass Design Easy," retrieved from https://community.freescale.com/community/the-embedded-beat/blog/2011/01/12/magnetic-sensor-makes-electronic-compass-design-easy, Jan. 12, 2011, 5 pp.

Wijngaarden et al., "Fast Determination of 2D Current Patterns in Flat Conductors From Measurement of Their Magnetic Field," Physica C: Superconductivity, vol. 295, No. 3-4, Feb. 1, 1998, 9 pp.

Prosecution History from U.S. Pat. No. 8,848,431, dated Jan. 28, 2014 through Aug. 29, 2014, 36 pp.

* cited by examiner

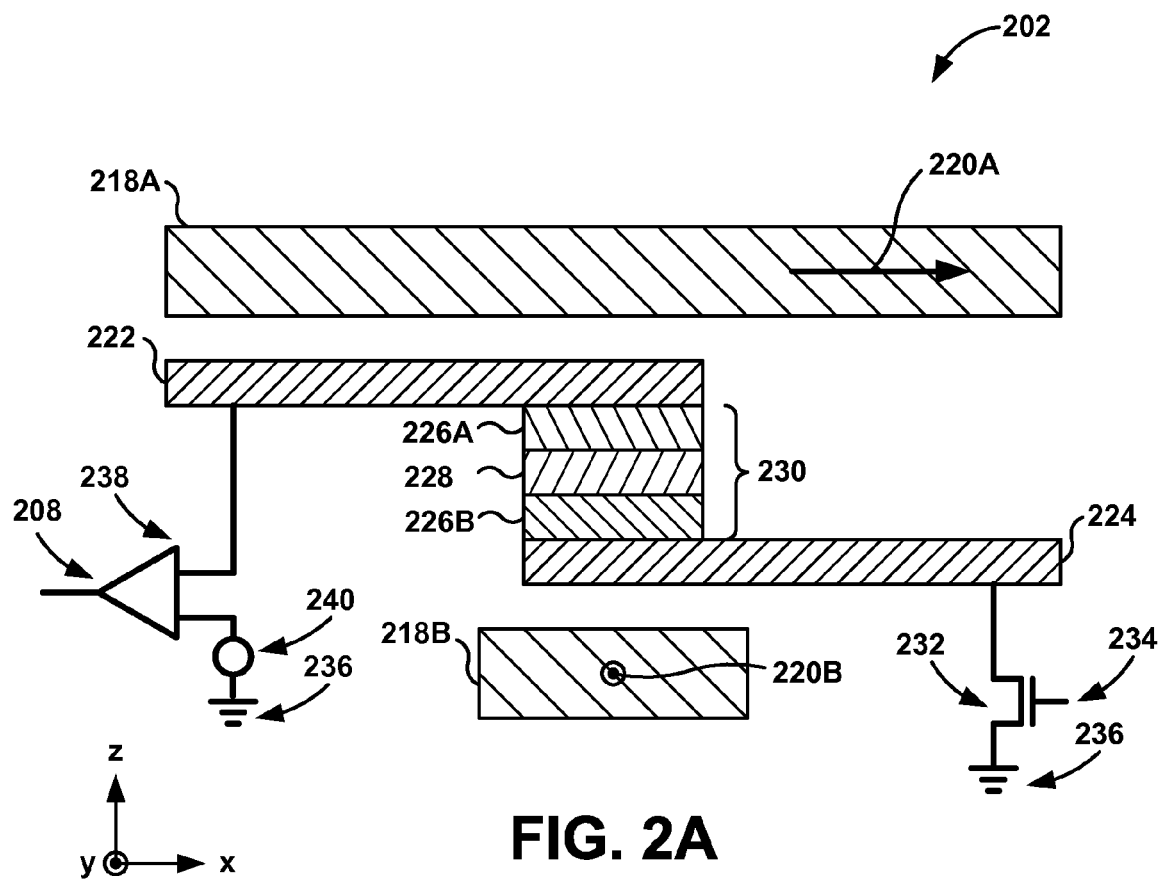
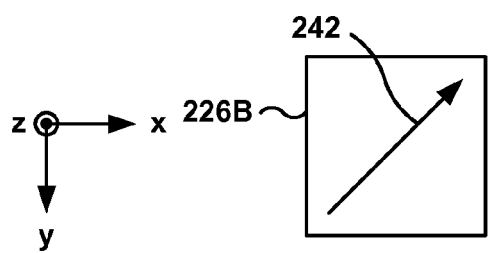 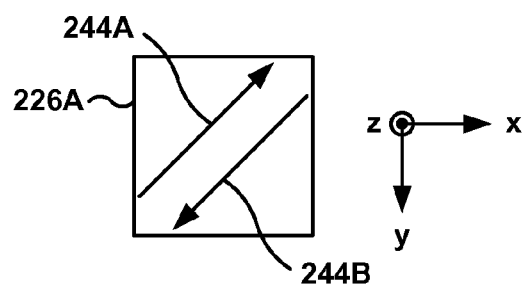
FIG. 2A
FIG. 2B  FIG. 2C

MAGNETIC FIELD SENSING USING MAGNETORESISTIVE RANDOM ACCESS MEMORY (MRAM) CELLS

This application is a continuation of U.S. patent application Ser. No. 13/561,478 by Katti et al., which was filed on Jul. 30, 2012, issued as U.S. Pat. No. 8,848,431 on Sep. 30, 2014 and is entitled, "MAGNETIC FIELD SENSING USING MAGNETORESISTIVE RANDOM ACCESS MEMORY (MRAM) CELLS." The entire content of U.S. patent application Ser. No. 13/561,478 by Katti et al. is incorporated herein by reference.

TECHNICAL FIELD

The disclosure relates to sensors, and, more particularly, to magnetic field sensors.

BACKGROUND

Magnetic field sensors may be used in a variety of applications that include determining one or more magnetic field properties, such as a presence of a magnetic field. For example, such applications may include electrical current sensing, object position sensing, navigation, as well as a number of other applications in which it may be desirable to determine one or more properties of magnetic fields. In some proposed techniques, magnetic field sensors are implemented using one or more magnetoresistive (MR) sensing elements, Hall-Effect sensing elements, or a combination of both.

SUMMARY

In general, this disclosure is directed to techniques, devices, and systems for sensing magnetic fields using one or more magnetoresistive random access memory (MRAM) cells. In some examples described herein, an MRAM cell may be used to determine one or more properties (also referred to herein as characteristics) of a magnetic field incident upon the MRAM cell. In one example, a magnitude of a write current of an MRAM cell is varied, such that a magnitude of a magnetic field induced by the write current proximate to the MRAM cell is less than a magnetic switching threshold of the MRAM cell. In this example, an external magnetic field incident upon the MRAM cell and having a magnitude which, in conjunction with the magnitude of the magnetic field induced by the write current, is greater than or equal to the magnetic switching threshold of the MRAM cell, may cause the MRAM cell to change its magnetic state. As a result, a presence of the external magnetic field having such a magnitude may be determined by detecting the change in the magnetic state of the MRAM cell. In another example, a magnitude and a polarity of the external magnetic field also may be determined using the magnitude of the write current, and a polarity of the write current, respectively.

In one aspect, this disclosure is directed to a magnetic field sensing system. The system includes an MRAM cell comprising a magnetic switching threshold, and a write line associated with the MRAM cell and configured to conduct a write current so as to induce a write magnetic field proximate to the MRAM cell. In the system, the write magnetic field has a magnitude that is less than the magnetic switching threshold of the MRAM cell. The system further includes a switching element electrically connected in series with the write line and configured to provide the write current from a write current source. In some examples, the magnetic field sensing system further comprises the write current source electrically coupled to the write line.

In another aspect, this disclosure is directed to a method of sensing a magnetic field. The method includes providing a write current through a write line associated with an MRAM cell so as to induce a write magnetic field proximate to the MRAM cell. In the method, the write magnetic field has a magnitude that is less than a magnetic switching threshold of the MRAM cell. The method further includes determining a magnetic state of the MRAM cell after initiating the provision of the write current through the write line. The method still further includes determining a presence of an external magnetic field incident upon the MRAM cell based at least in part on the magnetic state of the MRAM cell.

In another aspect, this disclosure is directed to a magnetic field sensing device. The device includes means for providing a write current through a write line associated with an MRAM cell so as to induce a write magnetic field proximate to the MRAM cell. In the device, the write magnetic field has a magnitude that is less than a magnetic switching threshold of the MRAM cell. The device further includes means for determining magnetic state of the MRAM cell after initiating the provision of the write current through the write line. The device still further includes means for determining a presence of an external magnetic field incident upon the MRAM cell based at least in part on the magnetic state of the MRAM cell.

The details of one or more examples are set forth in the accompanying drawings and the description below. Other features, objects, and advantages will be apparent from the description and drawings, and from the claims.

BRIEF DESCRIPTION OF DRAWINGS

FIGS. 2A-2C are conceptual diagrams that illustrate cross-sectional views of one example of an MRAM cell that may be included within the magnetic field sensing system of FIG. 1, and components thereof.

DETAILED DESCRIPTION

Figure 1:
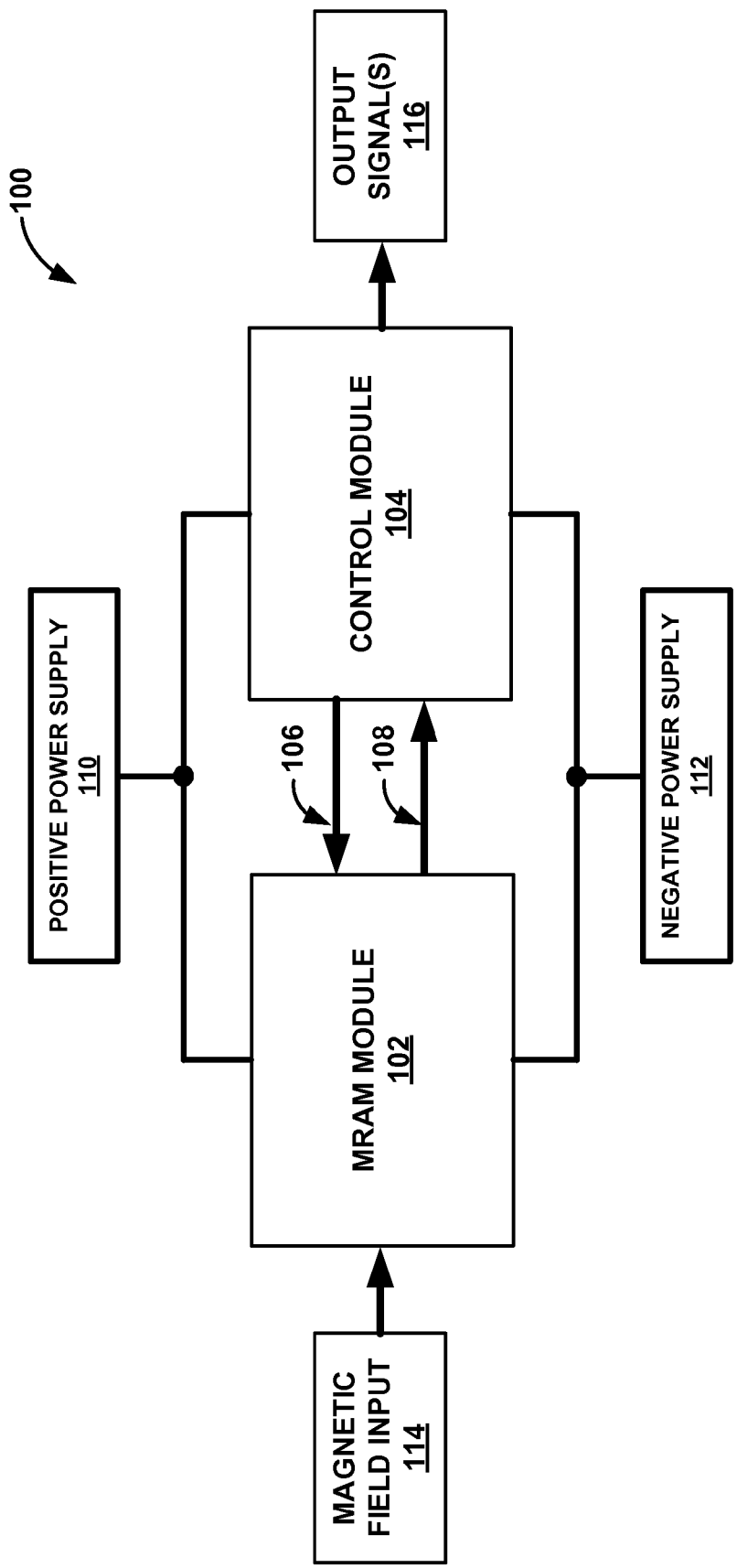
FIG. 1 is a functional block diagram that illustrates one example of a magnetic field sensing system that includes one or more MRAM cells.

A magnetic field sensing system may be used to detect the presence of a magnetic field, such as an external magnetic field, which is generated by a source that is external to the magnetic field sensing system. The magnetic field sensing system may be used to, for example, detect, measure, and retain magnetic field levels. Example applications of magnetic field sensing include, but are not limited to, detecting and buffering external magnetic field disturbances to a device or system (e.g., disturbances from stray magnetic fields, or from purposefully applied magnetic fields), and detecting and buffering exposures of the device or system to al magnetic fields.

In some examples described herein, a magnetic field sensing system includes one or more magnetoresistive random access memory (MRAM) cells. Each MRAM cell may have a magnetic switching threshold, which may be the threshold magnetic field magnitude level at which the MRAM cell changes magnetic state. The magnetic field sensing system may determine, using an MRAM cell, one or more properties of a magnetic field incident upon the MRAM cell. For example, as described in further detail below, a magnetic state of an MRAM cell of the system may indicate a presence, a magnitude, or a polarity of a magnetic field incident upon the magnetic field sensing system and the MRAM cell. In some examples, the magnetic field sensing system may include an MRAM device that includes multiple MRAM cells.

MRAM refers to a non-volatile memory technology in which data are stored using magnetic domains. Because MRAM is non-volatile, the data stored in the magnetic domains are maintained without requiring power to retain or continually refresh the magnetic domains. An MRAM cell of an MRAM device may respond similarly to a magnetic field that is induced locally relative to the MRAM cell, e.g., via write currents provided to a write line associated with the MRAM cell as part of a write operation performed in the MRAM device, as well as to external, e.g., stray, magnetic fields. As one example, a particular MRAM cell may respond to a magnetic field induced by a write current (referred to herein as a "write magnetic field") passing through a write line associated with the MRAM cell to change a magnetic state of the MRAM cell. In this example, a magnitude of the induced write magnetic field may be greater than or equal to a magnetic switching threshold of the MRAM cell so as to change its magnetic state. The same MRAM cell may respond in a similar manner, i.e., by changing its magnetic state, in response to an external magnetic field incident upon the MRAM cell when a magnitude of the external magnetic field is greater than or equal to the magnetic switching threshold.

Additionally, a magnetic state of an MRAM cell may change in response to a magnetic field resulting from a combination of an induced write magnetic field and an external magnetic field when a summed magnitude of the write magnetic field and the external magnetic field is greater than or equal to the magnetic switching threshold of the MRAM cell. The devices, systems, and techniques of this disclosure may, in some cases, take advantage of the above-described phenomenon in order to enable the use of one or more MRAM cells, and MRAM devices, generally, in magnetic field sensing applications, e.g., as magnetic field sensors.

In some examples, devices, systems, and methods for protecting the integrity of data stored within MRAM systems, for tamper protection, or both, may implement the magnetic field sensing techniques, devices, and systems described herein. An MRAM system including a plurality of MRAM cells may include a magnetic field sensing system that includes a subset of the plurality of MRAM cells, and data storage that includes another subset of the plurality of MRAM cells. In some examples, the MRAM system may be configured to take a responsive action in response to determining, using the magnetic field sensing system, that the MRAM system has been exposed to external magnetic fields having a particular magnitude, which may indicate that the data stored by the MRAM system may be compromised or otherwise tampered with (e.g., the external magnetic field may indicate the interrogation of the MRAM system).

The responsive action may include, for example, generation of a notification (e.g., activating an alarm or another notification device), activation of a locator device (e.g., a GPS device), causing information stored in the MRAM cells that store data to be erased or become unintelligible (e.g., by corrupting the data or causing a decryption key necessary to read the data in an intelligible form to be deleted). In some examples, the responsive action may comprise initiating damage or destruction to one or more components of the MRAM system, such by activating a destruction device to damage or destroy one or more of the MRAM cells. In some cases, the responsive action may include storing information relating to the event, for example, in an MRAM cell of the system, where the information may include, for example, the time at which the external magnetic field having a particular magnitude was sensed.

Devices and systems described herein may sense magnetic fields, e.g., by determining one or more properties of the magnetic fields, using one or More MRAM cells, including existing and emerging MRAM technologies. Additionally, the techniques described herein may be used to add magnetic field sensing functionality to MRAM devices used primarily for data storage, e.g., for purposes of providing diagnostic functionality and device tamper protection. In this manner, the techniques of this disclosure may enable magnetic field sensing devices (e.g., magnetic field sensors) that are implemented using MRAM technologies, as well as provide for novel and useful applications for sensing magnetic fields using MRAM devices.

FIG. 1 is a functional block diagram that illustrates one example of a magnetic field sensing system that includes one or more MRAM cells. As shown in FIG. 1, magnetic field sensing system 100 includes an MRAM module 102, a control module 104, a positive power supply 110, a negative power supply 112, and a magnetic field input 114. As also shown in FIG. 1, control module 104 is configured to provide one or more write control signal(s) 106 to MRAM module 102, and MRAM module 102 is configured to receive magnetic field input 114 and provide one or more read signals 108 to control module 104. In addition, as also shown in FIG. 1, control module 104 is configured to output one or more control module output signal(s) 116.

System 100 may comprise an electro-mechanical system or device of any suitable kind, including any combination of mechanical structural components and hardware, discrete electronic components, digital and/or analog circuitry and integrated devices, as well as mechanical and electronic sub-systems or sub-devices of any kind. In the example of FIG. 1, MRAM module 102 comprises one or more MRAM cells. Also in the example of FIG. 1, control module 104 is configured to control one or more components of system 100 (e.g., included within MRAM module 102, or elsewhere within system 100) to, for each of the one or more MRAM cells included within MRAM module 102, provide a write current through a write line associated with the respective MRAM cell so as to induce a write magnetic field proximate to the MRAM cell, such that a magnitude of the write magnetic field is less than a magnetic switching threshold of the MRAM cell. Examples of control module 104 are described in greater detail below. Examples of MRAM module 102 are also described in greater detail below, as well as with reference to MRAM cell 202 and MRAM module 302 of FIGS. 2 and 3, respectively.

According to the techniques of this disclosure, as one example, system 100, including MRAM module 102 and control module 104, may be configured as a magnetic field sensing system (also referred to as a "magnetic field sensing device" in some examples). In the example of FIG. 1, system 100 may be configured to sense external magnetic fields, such as by determining one or more properties, or characteristics, of magnetic field input 114, e.g., one or more of a presence, a magnitude, and a polarity of magnetic field input 114. System 100, and in particular, MRAM module 102 and control unit 104, may be configured to convert magnetic field input 114 from an external magnetic field, as described above, to one or more electrical signals representative of the external magnetic field in order to generate control module output signal(s) 116. In this way, system 100 is configured to sense an external magnetic field that provides magnetic field input 114. For example, control module output signal(s) 116 may comprise one or more voltage and/or current signals indicative of magnetic field input 114, including any combination of analog and/or digital signals, or other information, used to represent the one or more properties, or characteristics, of magnetic field input 114 previously described, as well as any other properties or characteristics.

As one example, control module output signal(s) 116 may comprise one or more values indicative of the presence of magnetic field input 114 (e.g., a "1" indicating that magnetic field input 114 is present, and a "0" indicating otherwise). As another example, control module output signal(s) 116 may comprise one or more values indicative of the magnitude of magnetic field input 114 (e.g., one or more values indicating the magnitude in units of amperes per meter (A/m), oersteds (Oe), or other units). As still another example, control module output signal(s) 116 may comprise one or more values indicative of a polarity of magnetic field input 114 (e.g., a "0" indicating that magnetic field input 114 has a positive polarity, and a "1" indicating that magnetic field input 114 has a negative polarity, or one or more vectors indicating the polarity of magnetic field input 114). In addition, control module output signal(s) 116 may represent any combination of the presence of magnetic field input 114, including a location of magnetic field input 114 relative to one or more MRAM cells included within MRAM module 102, the magnitude of magnetic field input 114, and the polarity of magnetic field input 114. In any case, in some examples, in addition to converting magnetic field input 114 from the external magnetic field to generate control module output signal(s) 116 used to represent the one or more properties of magnetic field input 114, as described above, control module 104 may further process magnetic field input 114 (e.g., filter, scale, normalize, level-shift, combine, etc.,) in any manner to generate control module output signal(s) 116.

In the example shown in FIG. 1, to convert magnetic field input 114 from the external magnetic field in order to generate control module output signal(s) 116, control module 104 is configured to communicate with MRAM module 102 via write control signal(s) 106 and read signal(s) 108, which are described in greater detail below with reference to FIG. 3. As described in further detail below control module 104 may use write control signal(s) 106 to control a write current source, a sink/source node, and/or one or more switching elements of MRAM module 102 to provide write currents through write lines associated with one or more MRAM cells of MRAM module 102. As will also be described, control module 104 may determine magnetic states of the one or more MRAM cells of MRAM module 102 based on read signal(s) 108.

Control module 104 may comprise any suitable arrangement of hardware, software, firmware, or any combination thereof, to perform the techniques attributed to control module 104 in this disclosure. For example, control module 104 may include any of one or more microprocessors, microcontrollers, digital signal processors (DSPs), application specific integrated circuits (ASICs), field programmable gate arrays (FPGAs), or any other equivalent integrated or discrete logic circuitry, as well as any combination of such components. Furthermore, control module 104 may include various types of analog circuitry, in addition to, or in place of, the logic devices and circuitry described above.

Positive power supply 110 and negative power supply 112 may each comprise any power supply unit, module, or circuitry also included within system 100, which may, in some examples, be integrated with MRAM module 102 and/or control module 104 within a common enclosure, or on a common printed board (PB). Although positive power supply 110, negative power supply 112, MRAM module 102, and control module 104 of system 100 are described as separate units of modules for conceptual purposes, in some examples, any combination of these components of system 100 may be functionally integrated within a common enclosure or housing.

In this disclosure, any reference made to a memory, or a memory device, used to store instructions, data, or other information, may include any volatile or non-volatile media, such as random access memory (RAM), read only memory (ROM), non-volatile RAM (NVRAM), electrically erasable programmable ROM (EEPROM), flash memory, magnetic memory (e.g., MRAM), and the like. In some examples, one or more memory devices may be external to system 100, MRAM module 102, and/or control module 104, for example, external to an enclosure or a common PB used to enclose or house system 100, MRAM module 102, and/or control module 104. In other examples, the one or more memory devices may be internal to system 100, MRAM module 102 MRAM cells included within MRAM module 102 for purposes of storing data), and/or control module 104, e.g., included within a common enclosure or housing, or on a common PB.

System 100 may comprise an MRAM cell (e.g., any of the one or more MRAM cells included within MRAM module 102) comprising a magnetic switching threshold. The magnetic switching threshold of the MRAM cell may correspond to a minimum magnitude of a magnetic field incident upon the MRAM cell that is required to change a magnetic state of the MRAM cell. For example, the magnetic switching threshold of the MRAM cell may be equal to the minimum magnitude.

In some examples, the magnetic switching threshold of the MRAM cell may vary, e.g., based on one or more factors, which may be environmental in some examples. For example, the magnetic switching threshold of the MRAM cell may vary based on a temperature of the environment in which the MRAM cell is operating (e.g., over a range of temperature in which MRAM module 102 that includes the MRAM cell is designed to be used), time (e.g., with use, or so-called "wear" of the MRAM cell), process (e.g., relative to a magnetic switching threshold of another MRAM cell, or an expected magnetic switching threshold, as a result of manufacturing the MRAM cell of this example), or based on any number of other factors or parameters of the MRAM cell and/or its use. In some examples, the magnetic switching threshold of the MRAM cell may vary by about up to about 5% (e.g., 5% or less) relative to a baseline value of the magnetic switching threshold (e.g., corresponding to a particular operating environment or state of the MRAM cell, or to an expected magnetic switching threshold of the MRAM cell), as a result of changes in one or more of the factors or parameters described above. As a result of some variance in the magnetic switching threshold of the MRAM cell, the minimum magnitude of the magnetic field incident upon the MRAM cell that is required to change the magnetic state of the MRAM cell may also vary by a relatively small percentage (e.g., by about 5% or less).

For this reason, in some examples, the magnetic switching threshold of the MRAM cell may be determined or estimated based on the various factors or parameters of the MRAM cell and its use described above, for purposes of performing the techniques of this disclosure. For example, the magnetic switching threshold of the MRAM cell, as described herein, may correspond to a magnetic switching threshold that is determined for the MRAM cell, or to a magnetic switching threshold that is estimated for the MRAM cell, based on one or more of the above-described factors or parameters of the MRAM cell and its use. Furthermore, the magnetic switching threshold of the MRAM cell may be adjusted as part of performing the techniques of this disclosure based any of the above-described factors or parameters of the MRAM cell and its use, e.g., at any time prior to, during, and following performing the disclosed techniques.

System 100 may still further comprise a write line (e.g., also included within MRAM module 102) associated with the MRAM cell and configured to conduct a write current so as to induce a write magnetic field proximate to the MRAM cell, wherein the write magnetic field has a magnitude that is less than the magnetic switching threshold of the MRAM cell. In some examples, the magnitude of the write magnetic field may be a first magnitude, and may be directly proportional (e.g. linearly proportional) to a second magnitude of the write current.

System 100 may further include a write current source electrically coupled to the write line, and a switching element electrically connected in series with the write line and configured to provide the write current from the write current source through the write line (e.g., either or both of which may be included within or outside of MRAM module 102). Examples of the write current source and the switching element, as well as a sink/source node operable in conjunction with the write current source, are described below with reference to FIG. 3.

In some examples, control module 104 may be configured to control one or more of the write current source and the switching element to provide the write current from the write current source through the write line, such that the magnitude of the write magnetic field is less than the magnetic switching threshold of the MRAM cell. In these examples, control module 104 may be further configured to, after initiating the provision of the write current through the write line, determine a magnetic state of the MRAM cell. Also in these examples, control module 104 may be still further configured to determine a presence of an external magnetic field incident upon the MRAM cell based at least in part on the determined magnetic state of the MRAM cell.

In some examples, the magnetic state of the MRAM cell may correspond to a resistance of the MRAM cell. In these examples, to determine the magnetic state of the MRAM cell, control module 104 may be configured to determine the resistance of the MRAM cell.

In other examples, the magnetic state of the MRAM cell may comprise a current magnetic state of the MRAM cell, which may be, for example, the magnetic state of the MRAM cell at the time at which control module 104 determines the magnetic state. In these examples, control module 104 may be further configured to, prior to controlling the one or more of the write current source and the switching element to provide the write current, determine an initial magnetic state of the MRAM cell. Subsequently, to determine the current magnetic state of the MRAM cell, control module 104 may be configured to determine a change in the initial magnetic state of the MRAM cell.

In this manner, magnetic field sensing system 100 of FIG. 1 may be configured as a magnetic field sensing system comprising an MRAM cell comprising a magnetic switching threshold, a write line associated with the MRAM cell and configured to conduct a write current so as to induce a write magnetic field proximate to the MRAM cell, wherein the write magnetic field has a magnitude that is less than the magnetic switching threshold of the MRAM cell, and a switching element electrically connected in series with the write line and configured to provide the write current from a write current source.

FIGS. 2A-2C are conceptual diagrams that illustrate cross-sectional views of one example of an MRAM cell that may be included within magnetic field sensing system 100 of FIG. 1, and components thereof. As shown in FIG. 2A, MRAM cell 202 is a structure that is configured to store data (e.g., a single bit of data) magnetically. For example, MRAM cell 202 may include a fixed magnetic layer 226B, a tunnel barrier layer 228, and a free magnetic layer 226A. An orientation of a magnetic moment of fixed magnetic layer 226B of MRAM cell 202 is generally fixed for the temperatures and external magnetic fields in which the MRAM device (e.g., MRAM module 102 of FIG. 1) that includes MRAM cell 202 is designed to be used. An orientation of a magnetic moment of free magnetic layer 226A, however, may be switched (e.g., by writing data to MRAM cell 202) between two states, wherein each state may represent a value (e.g., a "0" or a "1") of a single bit of data stored using MRAM cell 202.

As shown in FIG. 2A, MRAM cell 202 may include a first write line 218A and a second write line 218B, which may be used to write data to MRAM cell 202. First write line 218A extends generally in an x-axis direction, as depicted in FIG. 2A, while second write line 218B extends generally in a y-axis direction, as also depicted in FIG. 2A. MRAM cell 202 also includes a magnetic stack 230, which includes free magnetic layer 226A, tunnel barrier layer 228, and fixed magnetic layer 226B. In some examples, magnetic stack 230 may be referred to as a magnetic tunnel junction (MTJ). In some examples, tunnel barrier layer 228 may include a dielectric, such as an oxide. In some examples, tunnel barrier layer 228 may include aluminum oxide ($Al_2O_3$) or magnesium oxide (MgO).

As shown in FIG. 2B, fixed magnetic layer 226B includes a relatively fixed, or "pinned," magnetic moment 242, also illustrated in FIG. 2B. In the illustrated example, pinned magnetic moment 242 is oriented at approximately a 45-degree angle relative to first write line 218A and second write line 218B (e.g., at approximately a 45-degree angle relative to both the x-axis and the y-axis in FIG. 2B, where orthogonal x-y-z axes are shown in FIGS. 2A-2C for ease of description). In some examples, fixed magnetic layer 226B may include a ferromagnetic metal or alloy, such as, for example, nickel (Ni), iron (Fe), or cobalt (Co), or alloys of Ni, Fe, or Co. Example alloys from which fixed magnetic layer 226B can be formed may include nickel iron (NiFe), cobalt iron (CoFe), and nickel iron cobalt (NiFeCo). In some examples, fixed magnetic layer 226B may be magnetically coupled to an antiferromagnetic layer, which acts to "pin" magnetic moment 242 of fixed magnetic layer 226B in the manner illustrated in FIG. 2B. The antiferromagnetic layer may include an antiferromagnetic alloy, such as, for example, iron manganese (FeMn), nickel manganese (NiMn), platinum manganese (PtMn), or iridium manganese (IrMn). In some examples, the antiferromagnetic layer may be a bilayer or multilayer, in which the layers have different compositions or magnetic properties.

In contrast to fixed magnetic layer 226B, free magnetic layer 226A includes a "free" magnetic moment that is free to rotate under influence of a sufficiently strong applied magnetic field, as illustrated in FIG. 2C. For example, in a similar manner as described above with reference to FIG. 1, the sufficiently strong applied magnetic field may have a magnitude that reaches or exceeds a magnetic switching threshold of MRAM cell 202, so as to allow the free magnetic moment to rotate in the manner described above. In some examples, free magnetic layer 226A may include a ferromagnetic metal or alloy, such as, for example, Ni, Fe, or Co, or alloys of Ni, Fe, or Co. Example alloys from which free magnetic layer 226A can be formed may include NiFe, CoFe, and NiFeCo.

For example, at any given time, free magnetic layer 226A may have a first free magnetic moment 244A or a second free magnetic moment 244B. Free magnetic layer 226A may be switched between first free magnetic moment 244A and second free magnetic moment 244B by the sufficiently strong magnetic field described above, such as a magnetic field generated by first write line 218A and/or second write line 218B, or, consistent with the techniques described herein, by an external magnetic field incident upon MRAM cell 202 (e.g., magnetic field input 114 of FIG. 1).

For example, the magnetic moment of free magnetic layer 226A may be switched between first free magnetic moment 244A and second free magnetic moment 244B using write currents (e.g., write current pulses) provided through first write line 218A and second write line 218B. In particular, an applied magnetic field (which may be referred to herein as a "write" magnetic field) may be induced proximate to free magnetic layer 226A by pulses of electrical current flowing through first write line 218A and second write line 218B. Consider an example in which the magnetic moment of free magnetic layer 226A begins with an orientation that corresponds to first free magnetic moment 244A, as illustrated in FIG. 2C. Electrical current may be sent through first write line 218A in a direction indicated by arrow 220A (e.g., in the direction of the x-axis of FIG. 2A) and the magnetic moment of free magnetic layer 226A may rotate to be substantially parallel to arrow 220B. While electrical current still flows through first write line 218A, electrical current may be sent through second write line 218B in a direction indicated by arrow 220B (e.g., in the direction of the y-axis of FIG. 2A, out of the plane FIG. 2A), bringing the magnetic moment of free magnetic layer 226A to a substantially 45 degree angle between arrows 220A and 220B. Current flow through first write line 218A is then ceased, and the magnetic moment of free magnetic layer 226A rotates to be substantially parallel to the direction of current flow through second write line 218B, indicated by arrow 220B. Finally, current flow through second write line 218B is ceased, and the magnetic moment of free magnetic layer 226A rotates to be oriented in a direction that corresponds to second free magnetic moment 244B. In other examples, electrical current may be sent through one or more of first write line 218A and second write line 218B in any of a variety of directions other than those indicated by arrows 220A and 220B.

The orientation of the magnetic moment of free magnetic layer 226A, i.e., one of first and second free magnetic moments 244A, 244B relative to the orientation of pinned magnetic moment 242 of fixed magnetic layer 226B, determines a resistance of magnetic stack 230. For example, the resistance of magnetic stack 230 when pinned magnetic moment 242 and the one of first and second free magnetic moments 244A, 244B are oriented substantially anti-parallel (i.e., the magnetic moment of free magnetic layer 226A corresponds to second free magnetic moment 244B) is greater than the resistance of magnetic stack 230 when pinned magnetic moment 242 and the one of first and second free magnetic moments 244A, 244B are oriented substantially parallel (i.e., the magnetic moment of free magnetic layer 226A corresponds to first free magnetic moment 244A).

Control module 104 (or another processor) may determine the relative resistance of magnetic stack 230 (i.e., for each of first and second free magnetic moments 244A, 244B of free magnetic layer 226A) by controlling the conduction of an electrical current through magnetic stack 230, e.g., from top electrode 222 (e.g., coupled to positive power supply 110 of FIG. 1), through magnetic stack 230, through bottom electrode 224, and, via transistor 232, to a ground node 236 (e.g., coupled to negative power supply 112 of FIG. 1). For example, transistor 232 may be referenced to ground node 236, as shown in FIG. 2A, and may be gated at gate terminal 234 using a control signal (e.g., one of read signal(s) 108 of FIG. 1) to conduct the current through magnetic slack 230. Additionally, using an op-amp 238 also shown in FIG. 2A, which includes a reference voltage 240 also referenced to ground node 236, the current passing through magnetic stack 230 may be compared to a baseline, or "standard" current.

In the example of FIG. 2A, the current passing through magnetic stack 230 generates a voltage between top electrode 222 and bottom electrode 224 (i.e., effectively between top electrode 222 and ground node 236) that is proportional to the resistance of magnetic stack 230. Control module 104 may compare this voltage to reference voltage 240, e.g., using op-amp 238, to generate an output signal, e.g., at output terminal 208 of op-amp 238, that is indicative of the resistance of magnetic stack 230 (e.g., another one of read signal(s) 108 of FIG. 1). In other words, the relative resistance of magnetic slack 230 described above comprises the data storage mechanism of MRAM cell 202. For example, a high resistance may correspond to a logical state of "1," while a low resistance may correspond to a logical state of "0," of MRAM cell 202. The logical state of MRAM cell 202 may be referred to herein as a "magnetic state" of MRAM cell 202.

Other configurations of MRAM cell 202 may also be used with the magnetic field sensing systems and devices described herein. For example, in other examples, rather than being referenced to ground node 236 having a ground potential, as indicated by the "ground" symbol used to depict ground node 236 in FIG. 2A, transistor 232 may be coupled to a positive power supply (not shown) (e.g., positive power supply 110) and configured to conduct an electrical current from the positive power supply, through bottom electrode 224, through magnetic stack 230, to top electrode 222. In these examples, top electrode 222 may correspond to a negative power supply (e.g., negative power supply 112, or ground node 236). Furthermore, in these examples, the input terminal of op-amp 238 that is electrically coupled to top electrode 222 as shown in FIG. 2A may be electrically coupled to bottom electrode 224, or to the positive power supply itself. In other words, in some examples, an electrical current may flow from top electrode 222, through magnetic stack 230 and bottom electrode 224, to ground node 236 via transistor 232. In other examples, however, the current may flow from a positive power supply electrically coupled to transistor 232, through bottom electrode 224 and magnetic slack 230, to top electrode 222 (which may be electrically coupled to ground node 236) via transistor 232.

Moreover, in still other examples, a ground node or plane of an overall system or device that includes MRAM cell 202 may correspond to any of first write line 218A, top electrode 222, bottom electrode 224, second write line 218B, and ground node 236. In this manner, ground node 236 as shown in FIG. 2A may not necessarily correspond to a ground node or plane of the overall system that includes MRAM cell 202, but rather to node or plane that has a positive or a negative polarity relative to the ground node or plane of the system.

In still other examples, first write line 218A may be electrically coupled to top electrode 222, thereby electrically coupling first write line 218A to free magnetic layer 226A of magnetic stack 230 via top electrode 222. In this manner, in some examples, first write line 218A may be used to write to MRAM cell 202, as described above, as well as to read from MRAM cell 202 by determining the magnetic state of MRAM cell 202, as also described above. In particular, in these examples, first write line 218A may be used to read from MRAM cell 202 using the techniques described above with reference to determining the relative resistance of magnetic stack 230.

For example, in cases in which first write line 218A is electrically coupled to top electrode 222, control module 104 (or another processor) may determine the relative resistance of magnetic stack 230 by controlling the conduction of an electrical current from first write line 218A and top electrode 222 (e.g., jointly coupled to positive power supply 110), through magnetic stack 230, through bottom electrode 224, and, via transistor 232, to a ground node 236 (e.g., once again coupled to negative power supply 112). In this example, the input terminal of op-amp 238 that is electrically coupled to top electrode 222 as shown in FIG. 2A may be electrically coupled to any of first write line 218A and top electrode 222. In this manner, first write line 218A may serve a similar purpose as top electrode 222 when determining the relative resistance of magnetic stack 230, and, therefore, the magnetic state of MRAM cell 202.

The above-described techniques may be used in examples in which MRAM cell 202 is configured to store a single bit of data, e.g., when MRAM cell 202 is configured for a data storage function. In contrast to the above-described examples in which MRAM cell 202 is configured as a data storage cell, in examples in which MRAM cell 202 is configured to sense magnetic field input 114, the magnitude of the magnetic field induced by the write current passing through each of one or more of first write line 218A and second write line 218B of FIG. 2A may be less than the magnetic switching threshold of MRAM cell 202, which may be the magnitude of the magnetic field needed to change the magnetic state of MRAM cell 200, in some examples. In other words, the write current passing through each of the one or more of first write line 218A and second write line 218B may be controlled using the techniques described herein to have a sufficiently low magnitude so as to the induce the magnetic field proximate to MRAM cell 202 to have the required (i.e., generally speaking, lower) magnitude than the magnetic switching threshold of MRAM cell 202. That is, in some examples, the write magnetic field induced by the write current provided through the one or more of first write line 218A and second write line 218B may be, by itself, insufficient to change the magnetic state of MRAM cell 202 (e.g., insufficient to switch the magnetic moment of free magnetic layer 226A). MRAM cell 202 may be controlled in this manner using a variety of techniques, including using a variety of variable write current sources, sink/source devices, and switching elements as described below with reference to FIG. 3, as well as other devices and techniques.

In examples in which MRAM cell 202 is configured to detect an external magnetic field, the magnetic moment of free magnetic layer 226A may be switched between first free magnetic moment 244A and second free magnetic moment 244B only when the total magnetic field to which free magnetic layer 226A is exposed is greater than or equal to the magnetic switching threshold of MRAM cell 202 described above. Because the internal write current, e.g., provided by first write line 218A and second write line 218B, induces a write magnetic field that has a magnitude that is less than the magnetic switching threshold, in these examples, the total magnetic field refers to the "internal" write magnetic field, in addition to an external magnetic field.

For example, the magnetic moment of free magnetic layer 226A may be switched between first free magnetic moment 244A and second free magnetic moment 244B only when the write magnetic field generated by the write current passing through each of one or more of first write line 218A and second write line 218B, in conjunction with the external magnetic field incident upon free magnetic layer 226A, is greater than or equal to the magnetic switching threshold of MRAM cell 202 described above. In addition, or instead, in some examples, the magnetic moment of free magnetic layer 226A may be switched between first free magnetic moment 244A and second free magnetic moment 244B when the external magnetic field alone constitutes the sufficiently strong magnetic field having a magnitude greater than or equal to the magnetic switching threshold of MRAM cell 202. In this manner, in accordance with the techniques of this disclosure, MRAM cell 202 may be configured to sense magnetic fields, including determining the one or more properties of magnetic fields described herein, rather than being configured to store a single bit of data.

Figure 3:
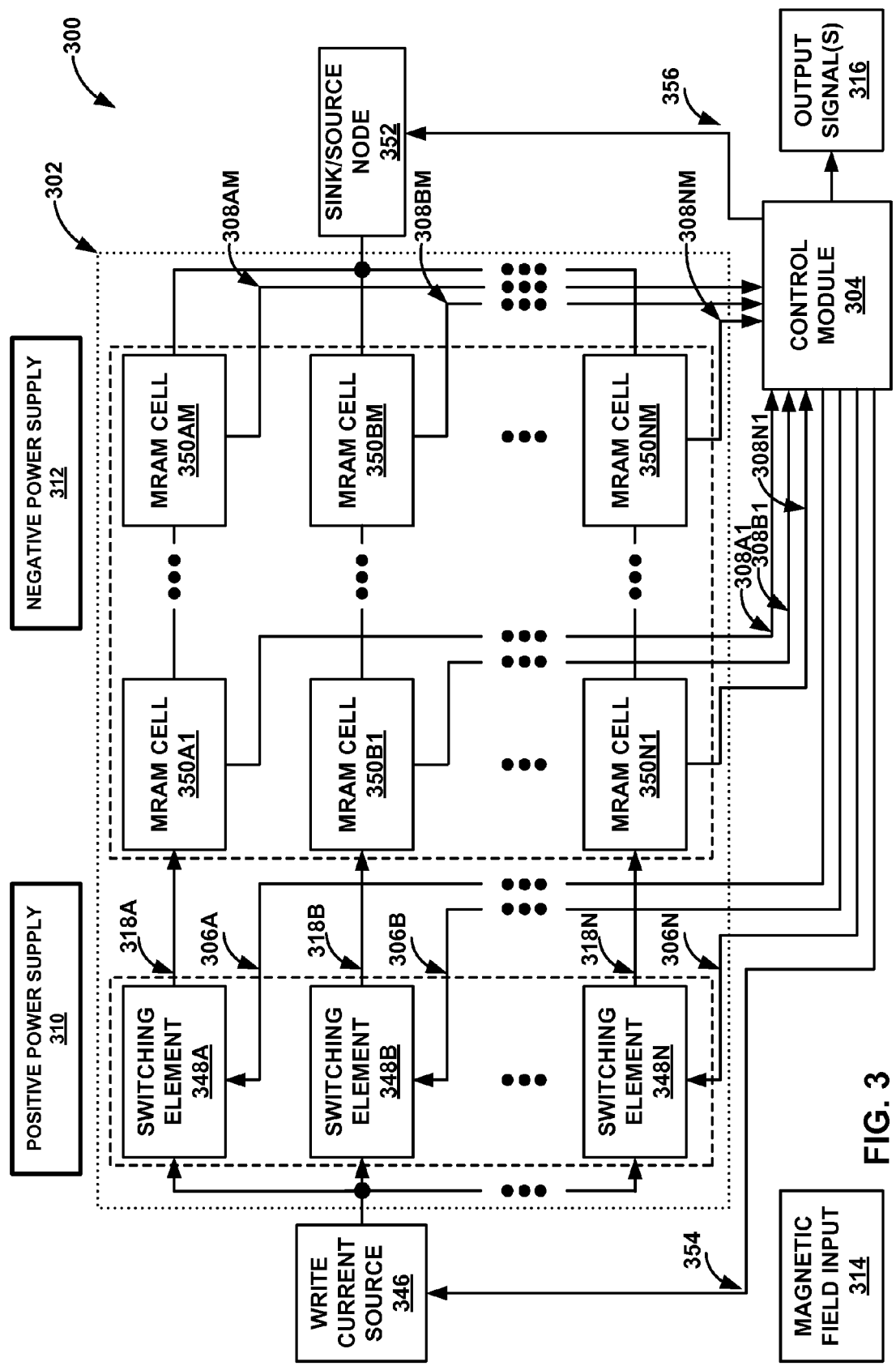
FIG. 3 is a conceptual diagram that illustrates one example of the magnetic field sensing system of FIG. 1 that includes a plurality of MRAM cells.

FIG. 3 is a conceptual diagram that illustrates magnetic field sensing system 300, which is an example of magnetic field sensing system 100 of FIG. 1 that includes a plurality of MRAM cells (e.g., a plurality of MRAM cells 202) and uses one or more of the plurality of MRAM cells to sense an external magnetic field. As shown in FIG. 3, magnetic field sensing system 300 includes an MRAM module 302, a control module 304, a positive power supply 310, a negative power supply 312, a magnetic field input 314, one or more control module output signal(s) 316, a write current source 346, and a sink/source node 352. In the example shown in NG. 3, control module 304 is configured to provide one or more write control signal(s) 306A-306N to a respective one of switching elements 348A-348N, and further configured to provide one or more write current source control signal(s) 354 to write current source 346. In addition, control module 304 is configured to provide one or more sink/source node control signal(s) 356 to sink/source node 352. In the example of FIG. 3, write current source control signal(s) 354 and sink/source node control signal(s) 356 also may be considered write control signals. Finally, MRAM module 302 is configured to provide one or more read signal(s) 308A1-308NM to control module 304.

It should be noted that magnetic field sensing system 300 may be similar to magnetic field sensing system 100 of FIG. 1, as described above. For example, MRAM module 302, control module 304, positive power supply 310, negative power supply 312, magnetic field input 314, write control signal(s) 306A-306N and write current source control signal(s) 354 and sink/source node control signal(s) 356, read signal(s) 308A1-308NM, and control module output signal(s) 316, may be similar to the respective ones of MRAM module 102, control module 104, positive power supply 110, negative power supply 112, magnetic field input 114, write control signal(s) 106, read signal(s) 108, and control module output signal(s) 116 of magnetic field sensing system 100 of FIG. 1. Moreover, write current source 346 and a sink/source node 352 may correspond to, or be included within, one or more components of magnetic field sensing system 100 of FIG. 1, e.g., within one or more of positive power supply 110, negative power supply 112, MRAM module 102, and control module 104.

In the example of Ha 3, MRAM module 302 includes a plurality of switching elements 348A-348N, a plurality of write lines 318A-318N, and a plurality of MRAM cells 350A1-350NM. As illustrated in FIG. 3, each of switching elements 348A-348N may be electrically coupled to a respective one of write lines 318A-318N, which may in turn be associated with a respective one or more of MRAM cells 350A1-350NM. For example, as shown in FIG. 3, each of write lines 318A-318N may be associated with a respective one or more of MRAM cells 350A1-350NM, such that, e.g., write line 318A is associated with MRAM cells 350A1-350AM, write line 318B is associated with MRAM cells 350B1-350BM, and write line 318N is associated with MRAM cells 350N1-350NM. In other words, in some examples, a single one of write lines 318A-318N may be used to conduct a write current for one or more of MRAM cells 350A1-350AM, as shown in FIG. 3. As described above with reference to MRAM cell 202 of FIG. 2A, each of write lines 318A-318N may correspond to a bit write line or a digit write line of the associated one of MRAM cells 350A1-350NM.

In some examples, MRAM cells 350A1-350NM may be arranged in one or more rows and/or columns, wherein each of write lines 318A-318N corresponds to a particular row or column for a subset of MRAM cells 350A1-350NM. For example, write line 318A may correspond to a row or a column that includes MRAM cells 350A1-350AM, write line 318B may correspond to a row or a column that includes MRAM cells 350B1-350BM, and write line 318C may correspond to a row or a column that includes MRAM cells 350N1-350NM. In other examples, additional write lines may be present, in addition to write lines 318A-318N depicted in FIG. 3, that correspond to additional rows and columns for MRAM cells 350A1-350NM. For example, an additional write line may be present that corresponds to a row or a column that includes MRAM cells 350A1, 350B1, and 350N1. Similarly, an additional write line may be present that corresponds to a row or a column that includes MRAM cells 350AM, 350BM, and 350NM.

Each of switching elements 348A-348N is electrically connected in series with a corresponding one of write lines 318A-318N and configured to provide a write current through the corresponding one of write lines 318A-318N from write current source 346 (e.g., via sink/source node 352), which is electrically coupled to write lines 318A-318N. As depicted in FIG. 3, in some examples, switching elements 348A-348N are located between write current source 346 and write lines 318A-318N, such that write current source 346 is coupled to write lines 318A-318N via a respective one of switching elements 348A-348N. In other examples, switching elements 348A-348N may be located elsewhere within MRAM module 302, e.g., between adjacent ones of MRAM cells 350A1-350NM along the length of write lines 318A-318N, or between MRAM cells 350A1-350NM and sink/source node 352.

In some examples, each of switching elements 348A-348N may include one or more of a bipolar junction transistor (BJT)-based switching device, a metal oxide semiconductor field effect transistor (MOSFET)-based switching device, or other device or circuitry for providing the switching functionality described above with reference to switching elements 348A-348N. In some examples, each of switching elements 348A-348N may be configured to merely conduct a current from write current source 346, or from another source (e.g., sink/source node 352), in order to provide the respective write current through the corresponding one of write lines 318A-318N. In these examples, a magnitude of the current from write current source 346, or from the other source, may be either fixed or variable. For example, control module 304 may vary the magnitude of the current via write current source and sink/source node control line(s) 354, 356, as described in greater detail below. In other examples, each of switching elements 348A-348N may itself comprise a current source configured to provide the respective write current through the corresponding one of write lines 318A-318N, e.g., by dynamically varying the magnitude of the current from write current source 346, or from the other source, in order to provide the write current. In this manner, in some examples, switching elements 348A-348N may be configured to vary a magnitude of the write current provided through each of write lines 318A-318N.

Additionally, in the example of FIG. 3, each of write current source 346 and sink/source node 352 may correspond to, or be derived from, one or more of positive power supply 310 or negative power supply 312. For example, write current source 346 may supply (i.e., source) the write current for each of write lines 318A-318N from positive power supply 310, and sink/source node 352 may provide a return path for (i.e., sink) the write current to negative power supply 312. As another example, sink/source node 352 may supply the write current for each of write lines 318A-318N from positive power supply 310, and write current source 346 may provide the return path for the write current. Furthermore, in some examples, each of write current source 346 and sink/source node 352 may be dynamically configured (e.g., by control module 304 via write current source and sink/source node control line(s) 354, 356) to source and/o sink the write current for each of write lines 318A-318N between positive power supply 310 and negative power supply 312. In other words, in some examples, each of write current source 346 and sink/source node 352 may be dynamically configured to either source or sink the write current, and thereby vary a polarity of the write current, provided through each of write lines 318-318N.

In some examples, one or more write current source 346 and sink/source node 352 may be included within each of MRAM module 302, control module 302, or within another module of unit of system 300 (e.g., as one or more high or low-side drivers, current sources, or equivalent circuitry or components, or as power and ground terminals, of MRAM module 302, control module 304, or another module of unit of system 300). As discussed above, in some examples, each of write current source 346 and sink/source node 352 may be integrated, or configured in an interoperable manner, with one or more of positive power supply 310 and negative power supply 312 of system 300.

In the example shown in FIG. 3, each of switching elements 348A-348N may be controlled by control module 304 to provide the respective write current through the corresponding one of write lines 318A-318N using write control line(s) 306A-306N. Similarly, after providing the respective write current for each of MRAM cells 350A1-350NM, control module 304 may determine a magnetic state of each of MRAM cells 350A1-350NM via read line(s) 308A1-308NM.

In some examples, control module 304 is configured to dynamically vary a magnitude and a polarity of the write current provided through each of write lines 318A-318N, and, therefore, a magnitude and a polarity of the resultant write magnetic field induced proximate to the corresponding one of MRAM cells 350A1-350NM, as described in greater detail below with reference to FIG. 8, using write current source 346, sink/source node 352, and switching elements 350A1-350NM. In addition, control module 304 may be configured to control the relative timing of the write currents provided through each of write lines 318A-318N and the resultant write magnetic fields.

The sensitivity of magnetic field sensing system 300 to external magnetic fields may be directly related to the magnitude of the write current provided through each of write lines 318A-318N, the polarity of the write current, and the tinting of the write current (referred to herein as "sense parameters"). The sensitivity thresholds of magnetic field sensing system 300 may be varied by varying one or more of the sense parameters. For example, magnetic field sensing system 300 may be configured to detect an external magnetic field having at least a first magnitude when a first set of sense parameters are used, and magnetic field sensing system may be configured to detect an external magnetic field having at least a second magnitude when a second set of sense parameters are used, where the second magnitude is lower than the first magnitude. As a result, by varying any one or more of these sense parameters, control module 304, and system 300, generally, may be configured to sense magnetic fields having varying magnitudes and polarities at different times and over varying distances and area with respect to system 300. This may enable the same system 300 to be readily adaptable to a variety of applications without expensive and time consuming modifications.

In the example of FIG. 3, switching elements 348A-348N may be integrated within a common module or unit within MRAM module 302, as depicted by the dashed lines surrounding switching elements 348A-348N in FIG. 3. In other examples, switching elements 348A-348N may be separate from MRAM module 302 (e.g., in a different enclosure). In addition, in the example shown in FIG. 3, MRAM cells 350A1-350NM also may be integrated within a common module or unit within MRAM module 302, as also depicted by the dashed lines surrounding MRAM cells 350A1-350NM in FIG. 3. In some examples, although not shown in FIG. 3, MRAM cells 350A1-350NM may be separated into one or more sub-modules.

An MRAM cell (e.g., any of MRAM cells 350A1-350NM) of system 300 may have a magnetic switching threshold, which may, for example, correspond to a minimum magnitude of a magnetic field incident upon the MRAM cell that is required to change a magnetic state of the MRAM cell. In some examples, at least two MRAM cells (e.g., any two of 350A1-350NM) may have different magnetic switching thresholds. A write line (e.g., any of write lines 318A-318N) associated with the MRAM cell having the magnetic switching threshold may be configured to conduct a write current so as to induce a write magnetic field proximate to the MRAM cell, wherein the write magnetic field has a magnitude that is less than the magnetic switching threshold of the MRAM cell. A write current source (e.g., 346) may be electrically coupled to the write line, and a switching element (e.g., any of switching elements 348A-348N) may be electrically connected in series with the write line and configured to provide the write current from the write current source through the write line.

In other examples, control module 304 may be configured to control one or more of the write current source and the switching element to provide the write current from the write current source through the write line, such that the first magnitude of the write magnetic field is less than the magnetic switching threshold of the MRAM cell. Control module 304 may be further configured to, after initiating the provision of the write current through the write line, determine a magnetic state of the MRAM cell, and determine a presence of an external magnetic field (e.g., magnetic field input 314) incident upon the MRAM cell based at least in part on the determined magnetic state of the MRAM cell. In some examples, the magnetic state of the MRAM cell may correspond to a resistance of the MRAM cell. In these examples, to determine the magnetic state of the MRAM cell, control module 304 may be configured to determine the resistance of the MRAM cell.

Additionally, in other examples, the magnetic state of the MRAM cell may comprise a current magnetic state of the MRAM cell. In these examples, control module 304 may be further configured to, prior to controlling the one or more of the write current source and the switching element to provide the write current, determine an initial magnetic state of the MRAM cell. Subsequently, to determine the current magnetic state of the MRAM cell, control module 304 may be configured to determine a change, if any, in the initial magnetic state of the MRAM cell.

In some examples, the magnitude of the write magnetic field may comprise a first magnitude that is proportional to a second magnitude of the write current. In these examples, to control the one or more of the write current source and the switching element to provide the write current and to determine the magnetic state of the MRAM cell, control module 304 may be configured to control the one or more of the write current source and the switching element to vary iteratively one or more of the second magnitude of the write current so as to vary the first magnitude of the write magnetic field, and a polarity of the write current so as to vary a polarity of the write magnetic field. Control module 304 may be further configured to, for each iteration of varying the one or more of the second magnitude and the polarity of the write current, determine a respective magnetic state of the MRAM cell. In these examples, to determine the presence of the external magnetic field incident upon the MRAM cell, control module 304 may be configured to determine the presence of the external magnetic field based at least in part on each of the determined magnetic states of the MRAM cell. In addition, to determine one or more properties of the external magnetic field incident upon the MRAM cell, control module 304 may be configured determine the one or more properties of the external magnetic field based at least in part on each of the determined magnetic states of the MRAM cell. For example, the determined magnetic states of the MRAM cell in combination with the known magnitude of the write magnetic field may indicate, for example, the magnitude, polarity, or both, of the external magnetic field.

As illustrated by the example of FIG. 3, the MRAM cell may comprise a plurality of MRAM cells with respective magnetic switching thresholds. In some examples, MRAM module 302 includes a first MRAM cell, the magnetic switching threshold may comprise a first magnetic switching threshold, the write line may comprise a first write line, the write current may comprise a first write current, the write magnetic field may comprise a first write magnetic field, the magnitude may comprise a first magnitude, and the switching element may comprise a first switching element. In this example, magnetic field sensing system 300 may further comprise a second MRAM cell comprising a second magnetic switching threshold, a second write line associated with the second MRAM cell and configured to conduct a second write current so as to induce a second write magnetic field proximate to the second MRAM cell, wherein the second write magnetic field has a second magnitude that is less than the second magnetic switching threshold of the second MRAM cell, the write current source electrically coupled to the second write line, and a second switching element electrically connected in series with the second write line and configured to provide the second write current from the write current source through the second write line.

Additionally, in some examples, the MRAM cell may comprise a magnetic tunnel junction (MTJ) MRAM cell, e.g., as described above with reference to magnetic stack 230 of FIG. 2A. Furthermore, in other examples, the write line may comprise one of a bit write line and a digit write line. Finally, in still other examples, the MRAM cell, the write line, and the switching element may comprise a part of an MRAM device.

In some examples, control module 304 may be further configured to output one or more signals indicative of one or more properties of the external magnetic e.g., output signal(s) 316. As one example, output signal(s) 316 may include one or more signals indicative of the determined presence of the external magnetic field, as described above. As another example, output signals) 316 may include one or more signals indicative of the determined magnitude of the external magnetic field, as also described above. Finally, as still another example, output signal(s) 316 may include one or more signals indicative of the determined polarity of the external magnetic field, as also described above. For example, output signal(s) 316 may be output and/or stored in one or more memories, or memory devices, described above with reference to system 100 of FIG. 1. For example, output signal(s) 316, whether represented as a single signal, or a plurality of signals, may comprise one or More analog signals, one or more digital signals, or any combination thereof.

In this manner, magnetic field sensing system 300 of FIG. 3 may be configured as a magnetic field sensing system comprising one or more MRAM cells comprising a respective magnetic switching threshold, a write line associated with the MRAM cell and configured to conduct a write current so as to induce a write magnetic field proximate to the MRAM cell, wherein the write magnetic field has a magnitude that is less than the magnetic switching threshold of the MRAM cell, and a switching element electrically connected in series with the write line and configured to provide the write current from a write current source.

FIGS. 4-10 are flow diagrams that illustrate example methods of sensing a magnetic field and determining various characteristics thereof using a magnetic field sensing system that includes one or more MRAM cells. The techniques of FIGS. 4-10 may be performed by any processing unit or processor, whether implemented in hardware, software, firmware, or a combination thereof, and when implemented in software or firmware, corresponding hardware may be provided to execute instructions for the software or firmware. For purposes of example, the techniques of FIGS. 4-10 are described with respect to magnetic field sensing systems 100 (FIG. 1) and 300 (FIG. 3), MRAM modules 102 (FIG. 1) and 302 (FIG. 3) (e.g., each including one or more MRAM cells 202 of FIG. 2), and control modules 104 (FIG. 1) and 304 (FIG. 3), as well as various components thereof, although it should be understood that other systems or devices may be configured to perform similar techniques. Moreover, the steps illustrated in FIGS. 4-10 may be performed in a different order or in parallel, and additional steps may be added and certain steps omitted, without departing from the techniques of this disclosure.

Figure 4:
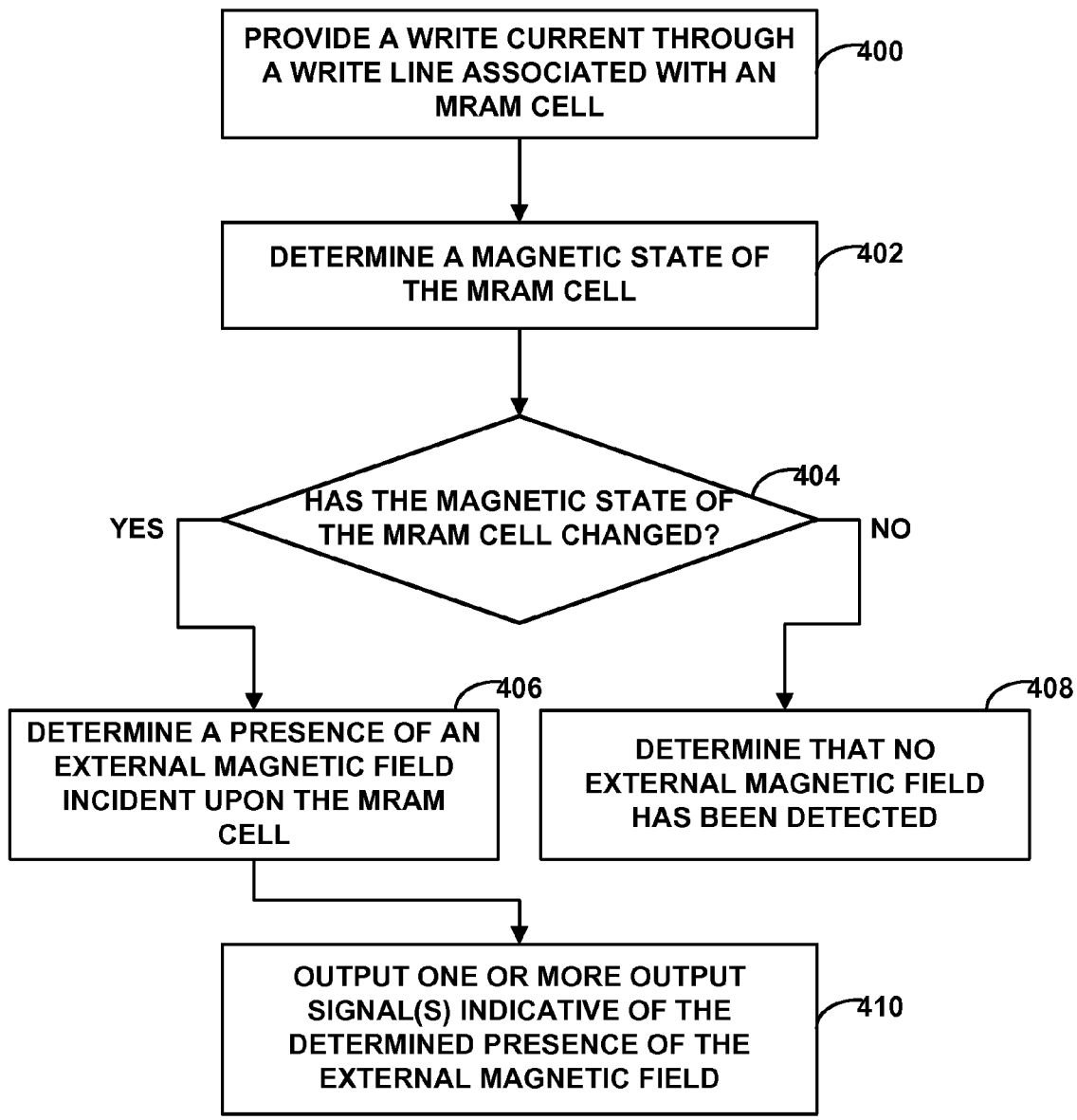
FIGS. 4-10 are flow diagrams that illustrate example methods of sensing a magnetic field and determining various characteristics thereof using a magnetic field sensing system that includes one or more MRAM cells.

FIG. 4 is a flow diagram of a method of sensing an external magnetic field incident upon an MRAM cell, and, in particular, determining a presence of the external magnetic field. As illustrated in FIG. 4, in one example, a control module (e.g., 104, 304) of a magnetic field sensing system (e.g., 100, 300) that includes the control module and an MRAM module (e.g., 102, 302) may be configured to sense a magnetic field (e.g., 114, 314) using an MRAM cell (e.g., any of 202, 350A1-350NM). For example, the MRAM module of the magnetic field sensing system may include the MRAM cell, as well as one or more additional MRAM cells, as previously described with reference to FIGS. 1 and 3.

In the example of FIG. 4, the control module may provide a write current through a write line (e.g., any of 318A-318N) associated with the MRAM cell so as to induce a write magnetic field proximate to the MRAM cell, wherein the write magnetic field has a magnitude that is less than a magnetic switching threshold of the MRAM cell (400).

As previously described with reference to FIGS. 1-3, the magnetic switching threshold of the MRAM cell may correspond to a minimum magnitude of a magnetic field incident upon the MRAM cell that is required to change a magnetic state of the MRAM cell. For example, the magnetic switching threshold of the MRAM cell may equal to the minimum magnitude of the magnetic field described above, which may be referred to as a minimum "strength" of the magnetic field. In some examples, the minimum magnitude may be defined as an instantaneous minimum magnitude. In other examples, the minimum magnitude may be defined using other representations, such as a Root-Mean-Square (RMS), an average, or another representation. In some examples, the minimum magnitude may correspond to a magnitude of an external magnetic field which the magnetic field sensing system is configured to detect, and may be one of a number of such magnitudes in instances where multiple MRAM cells included within the MRAM module have different magnetic switching thresholds.

In some examples, the control module provides the write current (400) by at least controlling one or more of a write current source electrically coupled to the write line (e.g., write current source 346) and a switching element electrically connected in series with the write line (e.g., any of 348A-348N) and configured to provide the write current from the write current source through the write line, to provide the write current through the write line. As one example, the control module may control the write current source to generate the write current such that the magnitude of the write magnetic field is less than the magnetic switching threshold of the MRAM cell, and control the switching element to deliver the generated write current. As another example, the write current source may provide a supply current, and the control module may control the switching element to modify the supply current to generate the write current, such that the magnitude of the write magnetic field is less than the magnetic switching threshold of the MRAM cell. In other words, in some examples, the control module may control the switching element so as to modify (e.g., modulate, or vary an amplitude of or "step") another current (e.g., a supply current having a fixed amplitude) to generate the write current.

As described above with reference to FIG. 3, the write current source, as well as a sink/source node (e.g., sink/source node 352) operable in conjunction with the write current source, may correspond to, or be derived from, one or more of a positive power supply (e.g., positive power supply 110 or 310) and a negative power supply (e.g., negative power supply 112 or 312) also included within the magnetic field sensing system. Furthermore, the switching element may include one or more of a BJT-based switching device, a MOSFET-based switching device, or other device or circuitry for providing the switching functionality described above with reference to the switching element. As also described above, in some examples, the switching element may itself comprise a current source configured to provide the write current through the write line, e.g., by varying a supply current from the write current source, or from another source, to generate the write current.

After initiating the provision of the write current through the write line, the control module may further determine a magnetic state of the MRAM cell (402). In some examples, the control module may determine the magnetic state of the MRAM cell during the provision of the write current, e.g., while the one or more of the write current source and the switching element are providing the write current through the write line. In other examples, the control module may determine the magnetic state of the MRAM cell after the provision of the write current, e.g., following the completion of the provision of the write current through the write line by the one or more of the write current source and the switching element. In this manner, some techniques of this disclosure include determining the magnetic state of the MRAM cell while providing the write current through the write line associated with the MRAM cell (e.g., during a write cycle of the MRAM cell), as well as at a subsequent point in time (e.g., during a read cycle of the MRAM cell, as described above with reference to FIG. 2). Accordingly, the techniques described herein may include providing the write current through the write line associated with the MRAM cell and determining the magnetic state of the MRAM cell bath contemporaneously and at different times.

In some examples, as described above with reference to FIG. 2, the magnetic state of the MRAM cell may correspond to a resistance of the MRAM cell. In these examples, to determine the magnetic state of the MRAM cell, the control module may determine the resistance of the MRAM cell, e.g., using the techniques for determining the resistance of magnetic stack 230 described above with reference to FIG. 2A.

As shown in FIG. 4, in response to determining the magnetic state of the MRAM cell has changed (404) ("YES"), the control module may determine a presence of an external magnetic field (e.g., 114, 314) incident upon the MRAM cell based at least in part on the determined magnetic state of the MRAM cell (406). On the other hand, in response to determining the magnetic state of the MRAM cell has not changed (404) ("NO"), the control module may determine that no external magnetic field has been detected (408).

In some examples, the determined magnetic state of the MRAM cell (402) may be referred to as a current magnetic state of the MRAM cell, e.g., the magnetic state of the MRAM cell at the time the control module determines the magnetic state. In these examples, the control module may further, prior to providing the write current (400), determine an initial magnetic state of the MRAM cell. In these examples, to determine the current magnetic state of the MRAM cell, the control module may determine a change in the initial magnetic state of the MRAM cell.

For example, in response to determining that the current magnetic state of the MRAM cell is the same as the initial magnetic state, the control module may determine that no external magnetic field has been detected (408). For example, the control module may determine that the MRAM cell was not exposed to an external magnetic field that has a magnitude which the magnetic field sensing system, or at least a subset of the system including the particular MRAM cell whose magnetic state did not change, is configured to detect. On the other hand, in response to determining that the current magnetic state of the MRAM cell is different than the initial magnetic state, the control module may determine a presence of the external magnetic field incident upon the MRAM cell (406). The control module may determine that the MRAM cell was exposed to an external magnetic field that has, at a minimum, the magnitude which the magnetic field sensing system is configured to detect.

In the example of FIG. 4, in response to determining the presence of the external magnetic field incident upon the MRAM cell (406), the control module may output one or more output signal(s) indicative of the detected presence of the external magnetic field (410).

Figure 5:
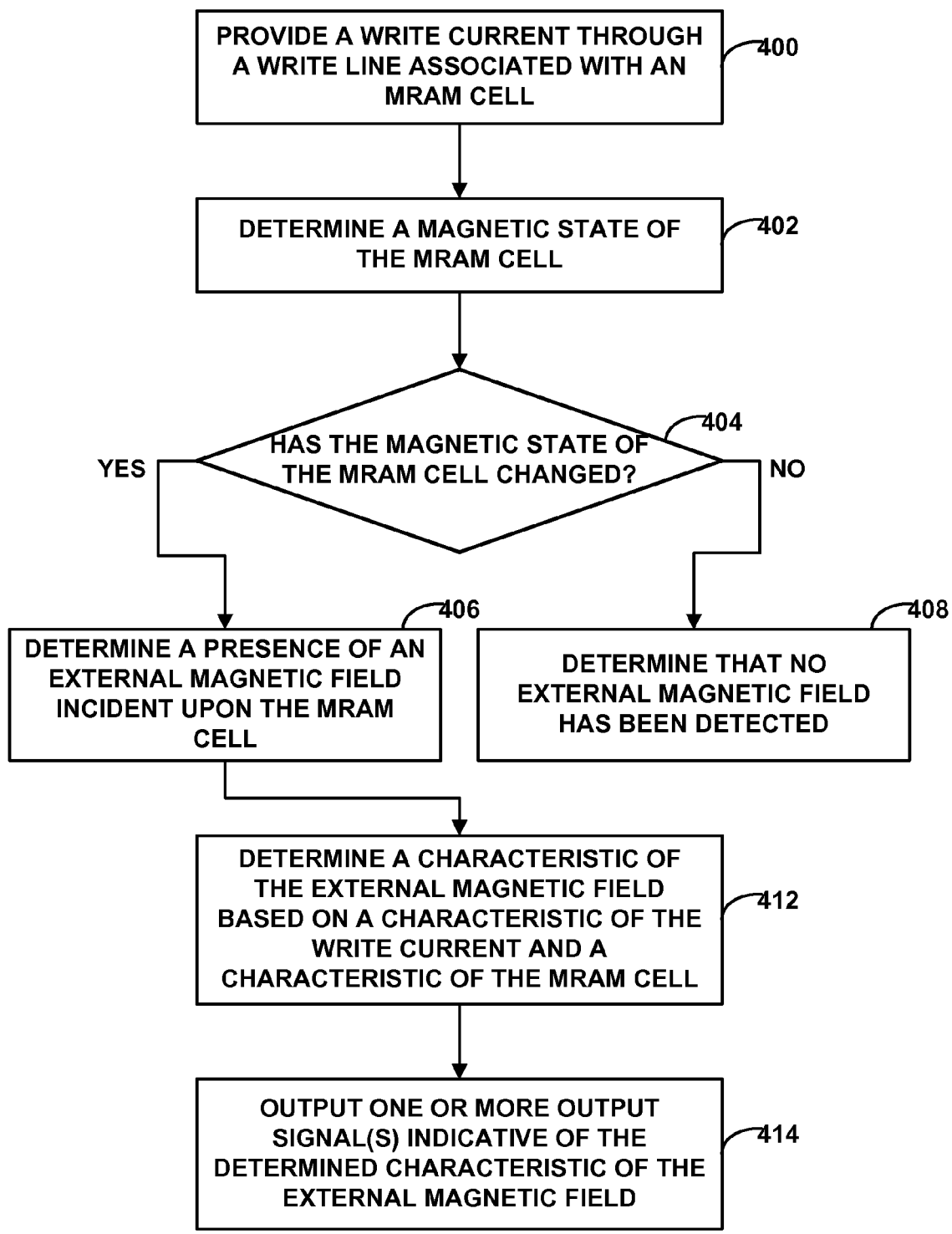

FIG. 5 is a flow diagram of a method of sensing an external magnetic field incident upon an MRAM cell, and, in particular, determining a presence and a characteristic of the external magnetic field. As with the technique described with respect to FIG. 4, in the method shown in FIG. 5, the control module provides a write current through a write line associated with an MRAM cell (400), determines a magnetic state of the MRAM cell (402), determines whether the magnetic state of the MRAM cell has changed (404), and determines one of a presence of an external magnetic field incident upon the MRAM cell (406), and that no external magnetic field has been detected (408) based on the magnetic state of the MRAM cell.

In the method of FIG. 5, if the control module determines the presence of an external magnetic field (406), the control module determines a characteristic of the external magnetic field based on a characteristic of the write current and a characteristic of the MRAM cell (412). For example, as described above, the characteristic of the write current may include one or more of a magnitude and a polarity of the write current, and the characteristic of the MRAM cell may include a magnetic switching threshold of the MRAM cell. Additionally, as also described above, and as will be described in greater detail below with reference to FIGS. 6 and 7, the characteristic of the external magnetic field may include one or more of a magnitude and a polarity of the external magnetic field. In the example of FIG. 5, the control module may further output one or more output signal(s) indicative of the determined characteristic of the external magnetic field (414).

Figure 6:
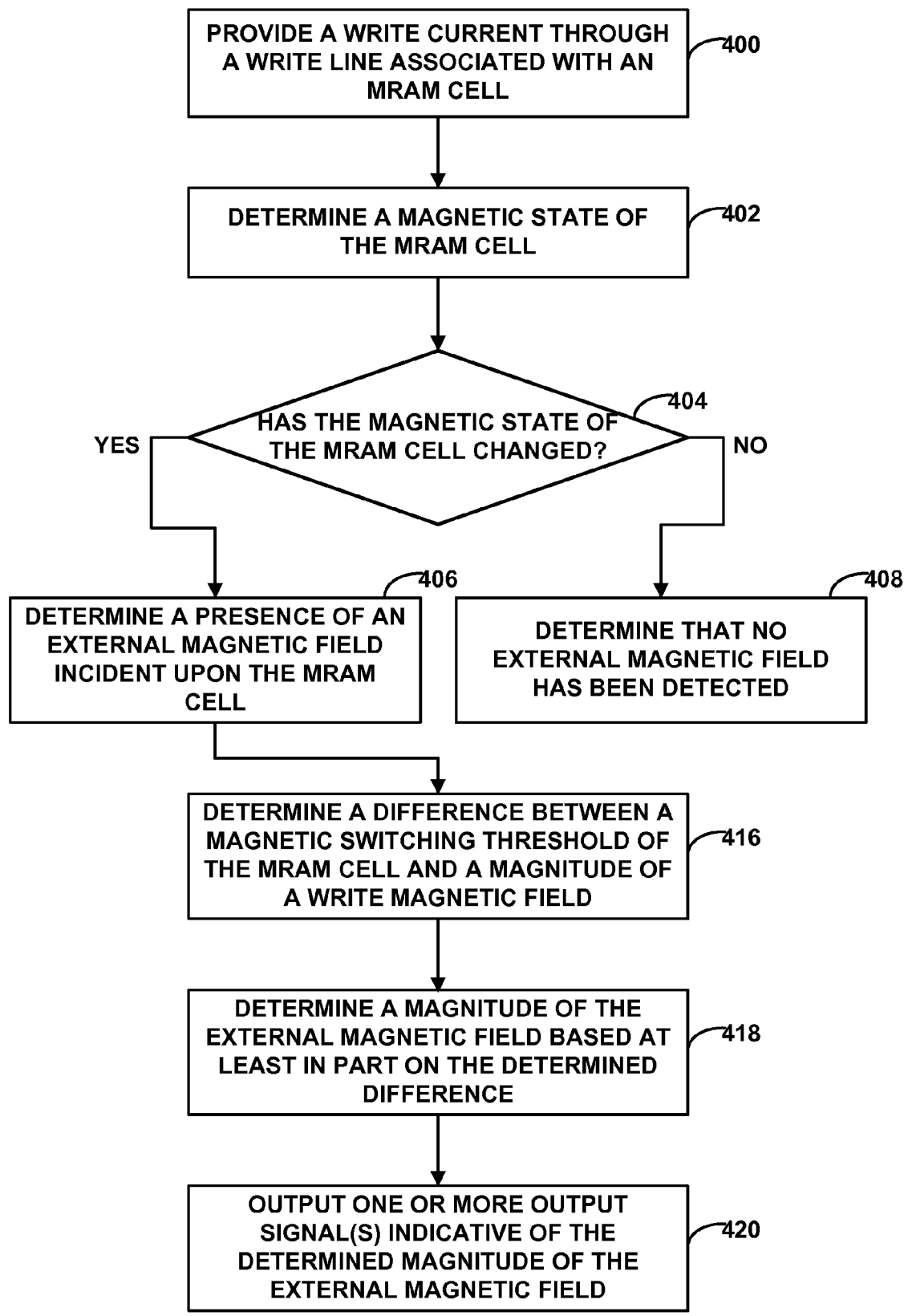

FIG. 6 is a flow diagram of an example of the method of FIG. 5 and illustrates an example technique for determining a characteristic of the external magnetic field based on a characteristic of the write current and a characteristic of the MRAM cell (block 412 in FIG. 5). As shown in FIG. 6, the method includes providing a write current through a write line associated with an MRAM cell (400), determining a magnetic state of the MRAM cell (402), determining whether the magnetic state of the MRAM cell has changed (404), and determining one of a presence of an external magnetic field incident upon the MRAM cell (406) and that no external magnetic field has been detected (408).

In the method of FIG. 6, to determine the characteristic of the external magnetic field based on the characteristic of the write current and the characteristic of the MRAM cell (block 412 in FIG. 5), the control module determines a magnitude of the external magnetic field. In other words, in the example of FIG. 6, the characteristic of the external magnetic field determined by the control module comprises a magnitude of the external magnetic field. As described above, the characteristic of the write current may include one or more of a magnitude and a polarity of the write current, and the characteristic of the MRAM cell may include a magnetic switching threshold of the MRAM cell.

In particular, in the example of FIG. 6, in the event the presence of the tat magnetic field incident upon the MRAM cell is detected (406), to determine the characteristic of the external magnetic field based on the characteristic of the write current and the characteristic of the MRAM cell (block 412 in FIG. 5), the control module may determine a difference between the magnetic switching threshold of the MRAM cell and the magnitude of the write magnetic field (416), which, as discussed above, is proportional to the magnitude of the write current. The control module may further determine the magnitude of the external magnetic field based at least in part on the determined difference (418).

As discussed above, the magnitude of the write current is proportional to the magnitude of the write magnetic field. In some examples, determining the presence of the external magnetic field as described above may indicate that the sum of the magnitudes of the external magnetic field and the write magnetic field is greater than or equal to the magnetic switching threshold of the MRAM cell. As such, upon determining the presence of the external magnetic field (406), the control module (e.g., control module 104 or 304) may determine the magnitude of the external magnetic field based on a difference between the magnitude of the write magnetic field and the magnetic switching threshold of the MRAM cell. In some examples, to determine the magnitude of the external magnetic field, the control module may utilize the following expression:

$$\text{Ext\_Field}_{MAG} \geq [\text{Field}_{TH}] - [\text{Write\_Field}_{MAG}] \quad \text{(Equation 1)}$$

Where $\text{Ext\_Field}_{MAG}$ is the magnitude of the external magnetic field, $\text{Field}_{TH}$ is the magnetic switching threshold of the MRAM cell, $\text{Write\_Field}_{MAG}$ is the magnitude of the write magnetic field, and the ">=" symbol indicates that $\text{Ext\_Field}_{MAG}$ is greater than or equal to the difference "$[\text{Field}_{TH}] - [\text{Write\_Field}_{MAG}]$." Accordingly, in some examples, the magnitude of the external magnetic field may be expressed as a magnitude of a magnetic field that, in conjunction with the magnitude of the write magnetic field, is required to reach or exceed (i.e., be greater than) the magnetic switching threshold of the MRAM cell, and thereby cause the MRAM cell to change its magnetic state.

As illustrated by the ">=" symbol in Equation 1 above, in some examples, the magnitude of the external magnetic field, in conjunction with the magnitude of the write magnetic field, may not merely reach, but also be greater than the magnetic switching threshold of the MRAM cell, and thereby cause the MRAM cell to change its magnetic state, as described above. In these examples, to determine the magnitude of the external magnetic field based on the difference between the magnetic switching threshold of the MRAM cell and the magnitude of the write magnetic field, the control module may require iteratively varying the magnitude of the write current (e.g., iteratively increasing the magnitude of the write current from a minimum value to a maximum value), until the MRAM cell changes its magnetic state, as described in greater detail with reference to FIG. 8. In these examples, the accuracy of the determined magnitude of the external magnetic field may depend on, e.g., an amount, or "step-size," by which the magnitude of the write current is varied for each iteration. For example, smaller step-sizes may result in greater accuracy of the determined magnitude of the external magnetic field. In other examples, the accuracy may also depend on a frequency of the iterations, as well as a frequency of the corresponding determinations of the magnetic state of the MRAM cell, which may be referred to as a sampling rate of the magnetic state. This may be the case, for example, in instances where the magnitude of external magnetic field varies over time with respect to the MRAM cell. In this manner, the determined magnitude of the external magnetic field may be referred to as an "estimated," rather than an actual magnitude of the external magnetic field.

In the example shown in FIG. 6, the control module may output one or more output signal(s) indicative of the determined magnitude of the external magnetic field (420). In this manner, the example method of FIG. 6 illustrates an example of a method of determining a magnitude of the external magnetic field based at least in part on the magnitude of the write current and the magnetic switching threshold of the MRAM cell.

Figure 7:
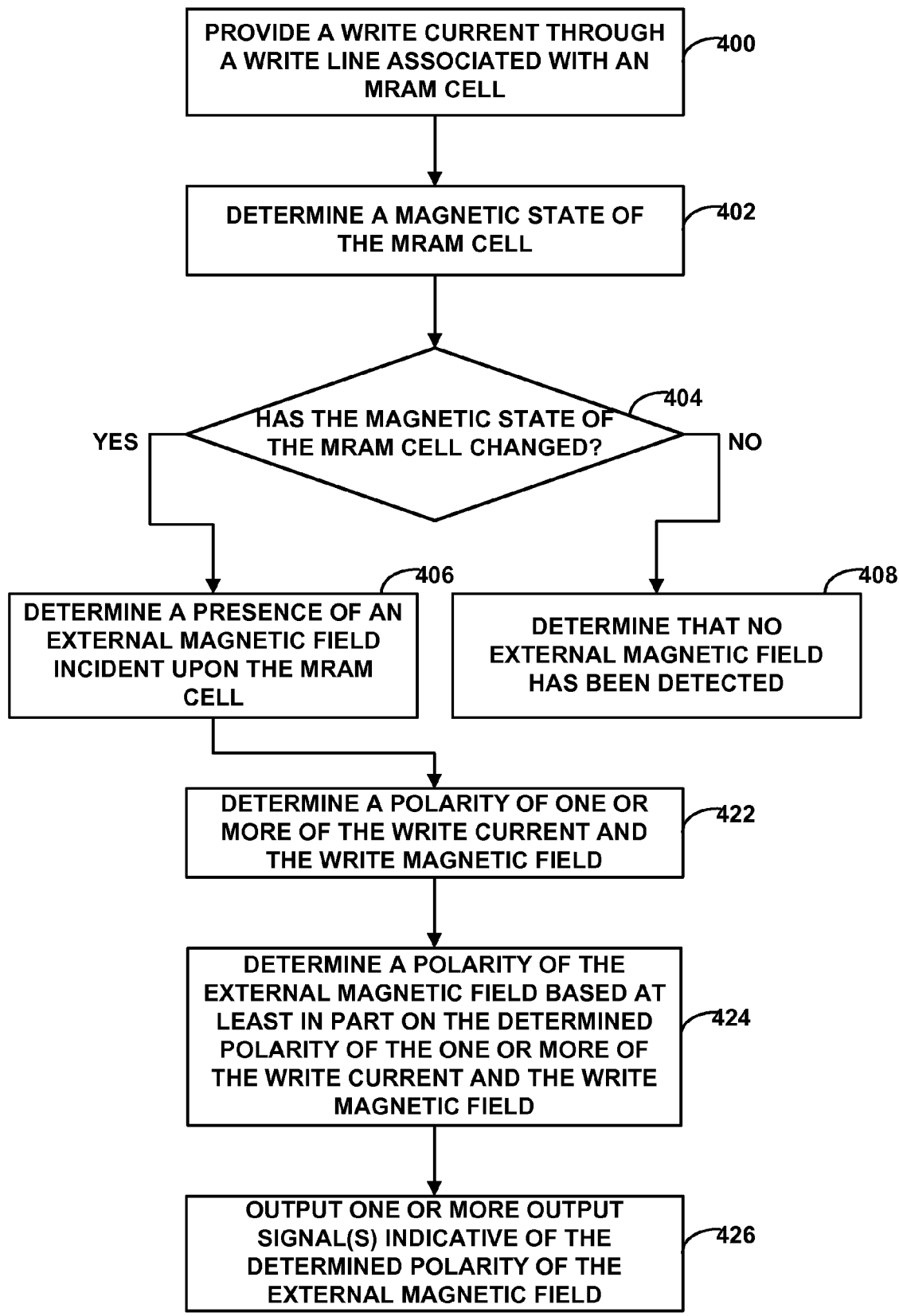

FIG. 7 is a flow diagram of another example of the method of FIG. 5 and illustrates an example technique for determining a presence and a polarity of the external magnetic field. The method of FIG. 7 includes the previously described steps of the method of FIG. 5 that relate to the control module providing a write current through a write line associated with an MRAM cell (400), determining a magnetic state of the MRAM cell (402), determining whether the magnetic state of the MRAM cell has changed (404), and determining one of a presence of an external magnetic field incident upon the MRAM cell (406) and that no external magnetic field has been detected (408).

In the method of FIG. 7, to determine the characteristic of the external magnetic field based on the characteristic of the write current and the characteristic of the MRAM cell (block 412 in FIG. 5), the control module determines a polarity of the external magnetic field. In other words, in the example of FIG. 7, the characteristic of the external magnetic field comprises a polarity of the external magnetic field. Once again, as described above, the characteristic of the write current may include one or more of a magnitude and a polarity of the write current, and the characteristic of the MRAM cell may include a magnetic switching threshold of the MRAM cell.

As shown in FIG. 7, in the event the presence of the external magnetic field incident upon the MRAM cell is determined (406), to determine the characteristic of the external magnetic field based on the characteristic of the write current and the characteristic of the MRAM cell (block 412 shown in FIG. 5), the control module (e.g., control module 104 or 304) may determine a polarity of one or more of the write current and the write magnetic field (422). The control module may further determine the polarity of the external magnetic field based at least in part on the determined polarity of the one or more of the write current and the write magnetic field (424).

As explained above, the magnitude of the write current is proportional to the magnitude of the write magnetic field. Moreover, the polarity of the write current is also determinative of i.e., is the same as, the polarity of the write magnetic field. For example, the polarity of the write magnetic field may be determined based on a direction, and, therefore, the polarity of the write current using the conventional "right-hand rule." In some examples, determining the presence of the external magnetic field as described above may indicate that the external magnetic field and the write magnetic field have a common polarity, such that the sum of the magnitudes of the respective fields is greater than or equal to the magnetic switching threshold of the MRAM cell. As such, upon determining the presence of the external magnetic field (406), the control module (e.g., control module 104 or 304) may further determine the polarity of the external magnetic field based on the polarity of the write current and/or the polarity of the write magnetic field, which, as discussed above, are determinative of one another. For example, to determine the polarity of the external magnetic field, the control module may utilize one of the following expressions:

$$\text{Ext\_Field}_{POL} = \text{SIGN}[\text{Write\_Field}_{MAG}] \quad \text{(Equation 2A)}$$

$$\text{Ext\_Field}_{POL} = \text{SIGN}[\text{Write\_Current}_{MAG}] \quad \text{(Equation 2B)}$$

Where $\text{Ext\_Field}_{POL}$ is the polar of the external magnetic field, $\text{Write\_Field}_{MAG}$ is the magnitude of the write magnetic field, $\text{Write\_Current}_{MAG}$ is the magnitude of the write current, and SIGN indicates a sign operator used to determine a sign of each of $\text{Write\_Field}_{MAG}$ and $\text{Write\_Current}_{MAG}$. In some examples, the polarity of the external magnetic field may be represented using a sign (e.g., "+" or "−") that corresponds to the polarity of the external magnetic field. In other examples, the polarity of the external magnetic field may be expressed as one or more vectors indicating the polarity of the external magnetic field.

In the example shown in FIG. 7, the control module may output one or more output signal(s) indicative of the determined polarity of the external magnetic field (426). In this manner, the example method of FIG. 7 illustrates an example of a method of determining a polarity of the external magnetic field based at least in part on a polarity of the write current.

Figure 8:
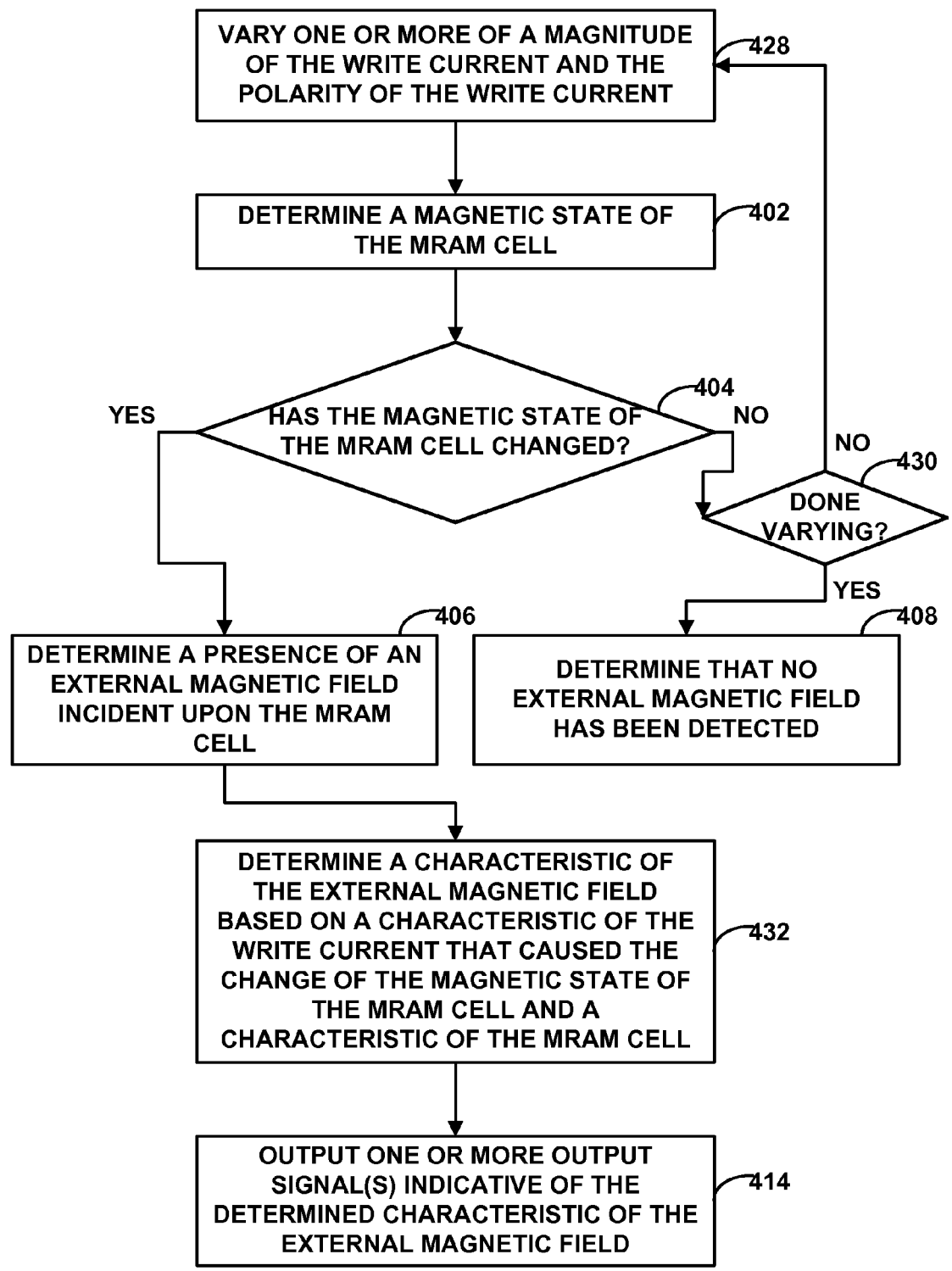

FIG. 8 is a flow diagram of a method of sensing an external magnetic field incident upon an MRAM cell, and, in particular, determining a presence and a characteristic of the external magnetic field by iteratively varying the write current. Specifically, in the example of FIG. 8, the magnitude of the write magnetic field may comprise a first magnitude that is proportional to a second magnitude of the write current. In this example, to provide the write current and determine the magnetic state of the MRAM cell, the control module may iteratively vary one or more of the second magnitude of the write current so as to vary the first magnitude of the write magnetic field, and a polarity of the write current so as to vary a polarity of the write magnetic field. In this example, for each iteration of varying the second magnitude, the polarity of the write current, or both, the control module may determine a respective magnetic state of the MRAM cell. In the method shown in FIG. 8, to determine the presence of the external magnetic field incident upon the MRAM cell, the control module may determine the presence of the external magnetic field based at least in part on the determined magnetic states of the MRAM cell. In some examples, the control module may further determine one or more characteristics of the external magnetic field, which may include one or more of a third magnitude and a polarity of the external magnetic field, e.g., as described above with reference to FIGS. 6 and 7.

In the technique shown in FIG. 8, for each magnitude, polarity, or combination of magnitude and polarity, selected by the control module, the control module provides a write current through a write line associated with an MRAM cell (not shown in FIG. 8), determines a magnetic state of the MRAM cell (402), determines whether the magnetic state of the MRAM cell has changed (404), determines a presence of an external magnetic field incident upon the MRAM cell (406) or that no external magnetic field has been detected (408), and, in response to determining the presence of an external magnetic field, determines a characteristic of the external magnetic field based on a characteristic of the write current and a characteristic of the MRAM cell (412). In the example of FIG. 8, to provide the write current through the write line associated with the MRAM cell (400), the control module varies one of more of a magnitude and a polarity of the write current (428).

In response to determining the magnetic state of the MRAM cell has not changed ("NO" branch of block 404), the control module may repeat (i.e., iterate) the above-described steps (428), (402), and (404) until the control module has completed (i.e., "is done") iteratively varying the one of more of the magnitude and the polarity of the write current ("YES" branch of block 430). For example, in response to determining the magnetic state of the MRAM cell has not changed (404) ("NO"), the control module may vary a magnitude of the write current, a polarity of the write current, or both the magnitude and polarity of the write current and provide the write current to the write line for the MRAM cell (428), and, subsequently, determine a magnetic state of the MRAM cell (402), and determine whether the magnetic state has changed (404) a predetermined number of times, after which point the control module may determine that no external magnetic field has been detected (408). The predetermined number of times may be selected to be suitable for the magnetic field sensing system.

In some examples, as shown in FIG. 8, in response to determining a presence of the external magnetic field incident upon the MRAM cell (406) (i.e., in the event the magnetic state of the MRAM cell has changed ("YES" branch of block 404)), the control module may determine a characteristic of the external magnetic field based on a characteristic of the write current selected by control module at block 428 shown in FIG. 8) that caused the change of the magnetic state of the MRAM cell, as well as the characteristic of the MRAM cell (432).

As one example, the control module may iteratively increase the magnitude of the write current from a minimum value to a maximum value (428) so as to correspondingly increase the magnitude of the induced write magnetic field, until the magnetic state of the MRAM cell changes to a different magnetic state. As another example, the control module may iteratively vary the polarity of the write current (428) so as to vary the polarity of the induced write magnetic field until the magnetic state of the MRAM cell changes to a different magnetic state. As yet another example, the control module may perform a combination of the above-described iterative variations of the magnitude and the polarity of the write current (e.g., perform a magnitude "sweep" for each polarity by switching the polarity of the write current for each write current magnitude) (428) until the magnetic state of the MRAM cell changes to a different magnetic state.

In this manner, by varying the one or more of the magnitude and the polarity of the write current, the magnetic field sensing system may be configured to not only detect a presence of an external magnetic field having a magnitude greater than or equal to the magnetic switching threshold of the MRAM cell, but also determine one or more of a magnitude and a polarity of the external magnetic field, as discussed above with reference to FIGS. 6 and 7. In each instance, the control module may perform the particular iterative variation(s) described above until the magnetic state of the MRAM cell changes to a different magnetic state, or until no change in the magnetic state of the MRAM cell is detected, in which case the control module may determine that no magnetic field has been detected (408).

In the example shown in FIG. 8, the control module may output one or more output signal(s) indicative of the determined characteristic of the external magnetic field (414).

In some examples, such as those described in greater detail below with reference to FIGS. 9 and 10, the MRAM module may include a plurality of MRAM cells. In these examples, the MRAM cell described above with reference to FIGS. 4-8 may comprise a first MRAM cell. Similarly, the magnetic switching threshold may comprise a first magnetic switching threshold, the write line may comprise a first write line, the write current may comprise a first write current, the write magnetic field may comprise a first write magnetic field, and the magnitude may comprise a first magnitude. In these examples, the control module may further provide a second write current through a second write line associated with a second MRAM cell so as to induce a second write magnetic field proximate to the second MRAM cell, wherein the second write magnetic field has a second magnitude that is less than a second magnetic switching threshold of the second MRAM cell. The control module may, after initiating the provision of the second write current through the second write line, determine a magnetic state of the second MRAM cell. The control module may determine a presence of an external magnetic field incident upon the second MRAM cell based at least in part on the determined magnetic state of the second MRAM cell.

In some examples, the provision of the first and second write currents described above may be performed simultaneously or at different times. Additionally, in some examples, the external magnetic field incident upon each of the first and second MRAM cells may be a same external magnetic field. In other examples, the external magnetic field incident upon the first MRAM cell may be different than the external magnetic field incident upon the second MRAM cell.

In some examples, the first magnetic switching threshold may be different than the second magnetic switching threshold, the first write current may be different than the second write current. Of both the first magnetic switching threshold may be different than the second magnetic switching threshold and the first write current may be different than the second write current. Accordingly, in some examples in which the MRAM module includes a plurality of MRAM cells, two or more MRAM cells of the plurality of MRAM cells may be configured to have different magnetic switching thresholds, two or more of the write currents provided through the write lines associated with the plurality of MRAM cells may be different (i.e., have different magnitudes and/or polarities), or any combination thereof. As a result, the two or more MRAM cells may be configured to detect magnetic fields having different properties (e.g., different absolute magnitudes, polarities, or both).

Figure 9:
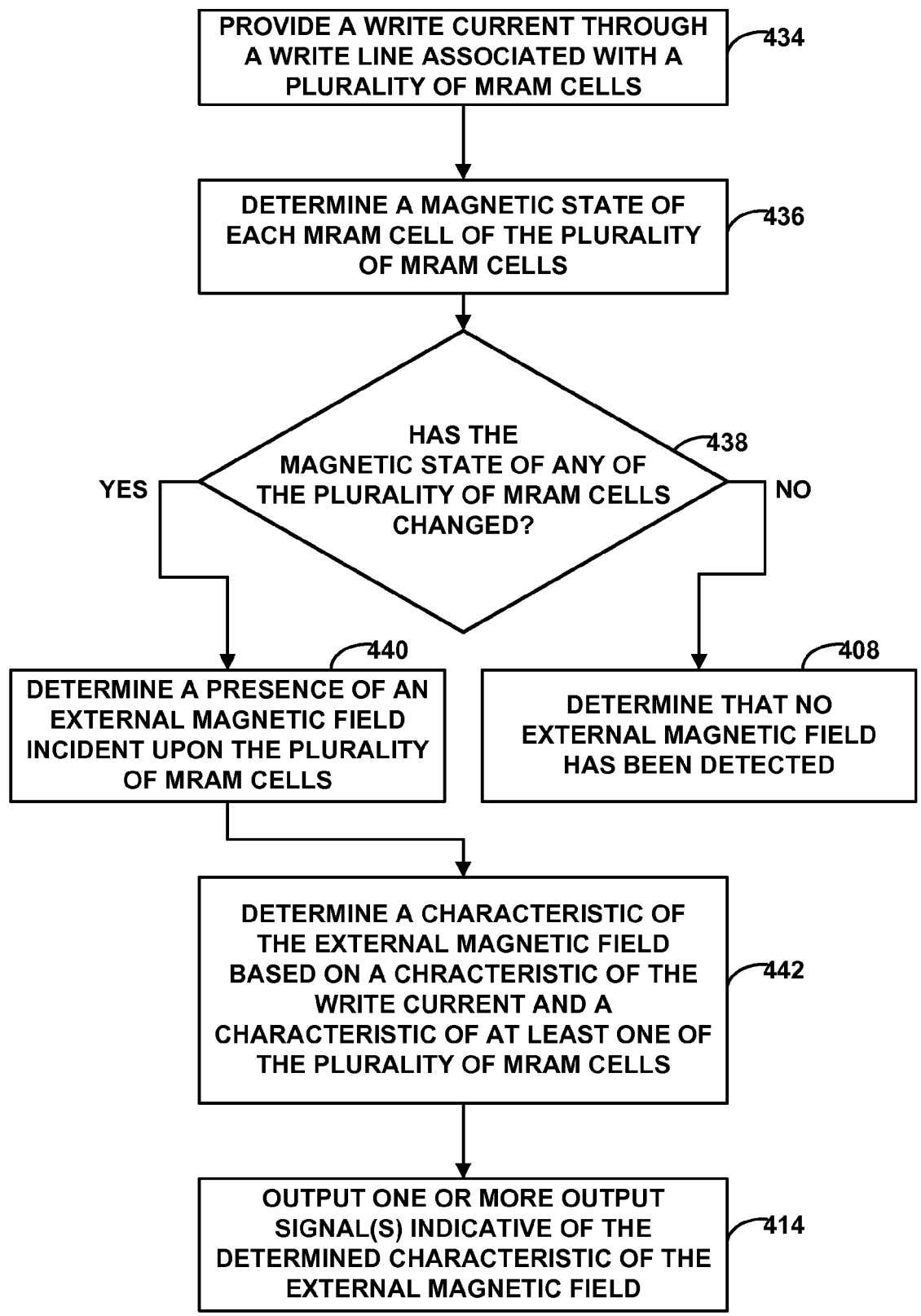
Figure 10:
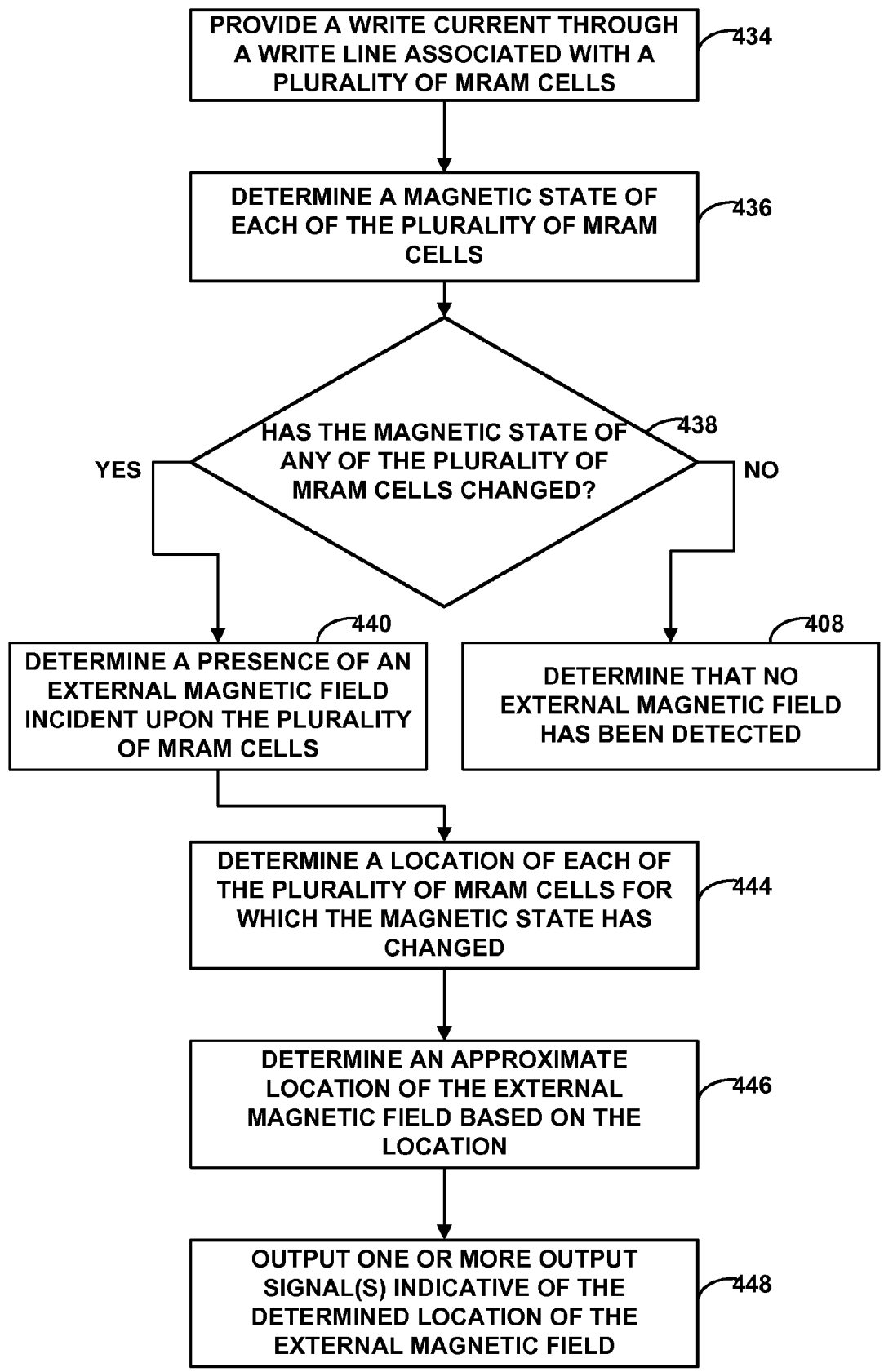

FIGS. 9 and 10 are flow diagrams of example methods of sensing external magnetic fields and various properties thereof in examples in which the MRAM module includes a plurality of MRAM cells. In the example of FIG. 9, each MRAM cell of the plurality of MRAM cells has a different magnetic switching threshold, but is associated with a common write line. In the example of FIG. 10, each MRAM cell of the plurality of MRAM cells has a same, or a substantially same magnetic switching threshold, and is associated with a common write line.

Other examples not illustrated in FIGS. 9 and 10 include any combination of the plurality of MRAM cells having same or different magnetic switching thresholds and being associated with same or different write lines. Moreover, in the example of each of FIGS. 9 and 10, the plurality of MRAM cells may be subset of a plurality of MRAM cells included within the MRAM module, which may include additional MRAM cells (e.g., MRAM cells that have same or different magnetic switching thresholds and that are associated with same or different write lines, including MRAM cells used for data storage).

As described below with reference to FIG. 9, the control module may, in some examples, determine one or more characteristics of the external magnetic field, which may include one or more of a magnitude and a polarity of the external magnetic field, e.g., using the techniques described above with reference to FIGS. 6 and 7.

FIG. 9 is a flow diagram illustrating an example of a method of sensing an external magnetic field incident upon a plurality (e.g., an array) of MRAM cells, and, in particular, determining a presence and a characteristic of the external magnetic field. The method of FIG. 9 includes steps that are similar to the previously described steps of the method of FIG. 4 that relate to the control module providing a write current through a write line associated with an MRAM cell (400), determining a magnetic state of the MRAM cell (402), determining whether the magnetic state of the MRAM cell has changed (404), and determining one of a presence of an external magnetic field incident upon the MRAM cell (406), and that no external magnetic field has been detected (408). However, in the example of FIG. 9, the control module provides a write current through a write line associated with a plurality of MRAM cells (434), determines a magnetic state of each MRAM cell of the plurality of MRAM cells (436), and determines whether the magnetic state of any of the plurality of MRAM cells has changed (438). In the technique shown in FIG. 9, the control module determines a presence of an external magnetic field incident upon the plurality of MRAM cells (440) or that no external magnetic field has been detected (408) based on the magnetic state of each MRAM cell of the plurality of MRAM cells. The technique shown in FIG. 9 may be implemented with an MRAM module (e.g., MRAM module 302 shown in FIG. 3) that includes a plurality of MRAM cells, where the write line is associated with (i.e., is common to) each MRAM cell of the plurality of MRAM cells. In some examples, two or more of the MRAM cells of the plurality of MRAM cells may have different magnetic switching thresholds, as described in greater detail below.

In some examples, as shown in FIG. 9, in response to detecting the presence of the external magnetic field incident upon the plurality of MRAM cells (440), the control module determines a characteristic of the external magnetic field (e.g., the magnitude, polarity, or both) based on a characteristic of the write current and a characteristic of at least one MRAM cell of the plurality of MRAM cells (442). The characteristic of the write current may include one or more of a magnitude and a polarity of the write current, and the characteristic of each MRAM cell of the plurality of MRAM cells may include a magnetic switching threshold of the respective MRAM cell.

In the example of FIG. 9, two or more MRAM cells of the plurality of MRAM cells magnetically coupled to a common write line may have different magnetic switching thresholds. In contrast to the technique shown in FIG. 8, by including at least two MRAM cells with different magnetic switching thresholds, a magnetic field sensing system may be configured to determine the presence and the one or more of the magnitude and the polarity of an external magnetic field via the delivery of one write current. For example, a first MRAM cell of the plurality of MRAM cells that has a first magnetic switching threshold may change its magnetic state, while a second MRAM cell of the plurality of MRAM cells that has a second, different magnetic switching threshold may not change its magnetic state. In this example, the presence of the external magnetic field may be determined based on the change of the magnetic state of the first MRAM cell. Additionally, in this example, the magnitude of the external magnetic field may be determined based on the first MRAM cell changing its magnetic state, and the second MRAM cell not changing its magnetic state. In examples in which the first magnetic switching threshold is less than the second magnetic switching threshold, the control module may determine a range of the magnitude of the external magnetic field based on the first and second magnetic switching thresholds and the magnitude of the write current. For example, the control module may determine the magnitude of the external magnetic field to be greater than or equal to the difference between the magnitude of the write magnetic field induced by the write current and the first magnetic switching threshold, and less than the difference between the magnitude of the write magnetic field induced by the write current and the second magnetic switching threshold.

In the example of FIG. 9, the control module may determine the characteristic (i.e., the magnitude and/or polarity) of the external magnetic field based on the characteristic (i.e., the magnitude and/or polarity) of the write current and the characteristic (i.e., the magnetic switching threshold) of the at least one of the plurality of MRAM cells (442) that either changed or did not change its magnetic state, e.g., at least one MRAM cell that changed its magnetic state, and at least one MRAM cell that did not change its magnetic state.

In other examples, the MRAM module may include additional MRAM cells having magnetic switching thresholds that are different than the first and second magnetic switching thresholds. In these examples, the magnitude of the external magnetic field may be determined to be greater than or equal to a difference between the magnitude of the write magnetic field induced by the write current and the magnetic switching threshold of a particular MRAM cell that changed state in response to the delivery of the write current, and less than a difference between the magnitude of the write magnetic field induced by the write current and the magnetic switching threshold of another MRAM cell that did not change state in response to the delivery of the write current. In this manner, in examples in which the MRAM module includes a large number of MRAM cells each comprising a different magnetic switching threshold, the magnetic field sensing system may be configured to sense a range of magnetic field magnitudes in fine increments, and the sensing system may sense and determine a magnitude of the external magnetic field within this range with a relatively high degree of accuracy compared to examples in which a single MRAM cell is used to determine the magnitude of the external magnetic field.

Moreover, the above-described techniques may be performed for various magnitudes and polarities of the write current, such that a magnetic field sensing system may be configured to detect not only a range of external magnetic field magnitudes, but also external magnetic fields having different polarities. In this manner, the control module may determine the characteristic of the external magnetic field based on the characteristic (i.e., the particular magnitude and/or polarity) of the write current, and the characteristic of the at least one of the plurality of MRAM cells (442), as described above. In some examples, as shown in FIG. 9, the control module may output one or more output signal(s) indicative of the determined characteristic of the external magnetic field (414).

FIG. 10 is a flow diagram of another example method of sensing an external magnetic field incident upon a plurality of MRAM cells, and, in particular, determining a presence and an approximate location of the external magnetic field relative to the plurality of MRAM cells. As shown in FIG. 10, the method of FIG. 10 includes the previously described steps of the method of FIG. 9 that relate to the control module providing a write current through a write line associated with a plurality of MRAM cells (434), determining a magnetic state of each of the plurality of MRAM cells (436), determining whether the magnetic state of any of the plurality of MRAM cells has changed (438), and determining one of a presence of an external magnetic field incident upon the plurality of MRAM cells (440), and that no external magnetic field has been detected (408). Once again, in the example of FIG. 10, the MRAM module includes a plurality of MRAM cells, and the write line is associated with each of the plurality of MRAM cells. In this example, however, each of the plurality of MRAM cells has a same, or a substantially same magnetic switching threshold, as will be described in greater detail below.

The method of FIG. 10 includes, in the event the presence of the external magnetic field incident upon the plurality of MRAM cells is determined (440), the control module determining a location of each of the plurality of MRAM cells for which the magnetic state has changed (444), and determining an approximate location of the external magnetic field based on the determined location (446). For example, the control module may determine a location of one or more of the plurality of MRAM cells for which the magnetic state has changed, indicating that the one or more of the plurality of MRAM cells have been exposed to the external magnetic field.

As discussed above, in the example of FIG. 10, each of the plurality of MRAM cells has a same, or a substantially same magnetic switching threshold. In this example, the determined location of each of the plurality of MRAM cells for which the magnetic state has changed may be indicative of the presence of the external magnetic field at the respective location. In this manner, once again, by including the plurality of MRAM cells within the MRAM module, but, in this case, by designating a same, or a substantially same magnetic switching threshold for each of the plurality of MRAM cells, the magnetic field sensing system may be configured to determine the presence and the approximate location of the external magnetic field relative to the plurality of MRAM cells. For example, a particular one of the one or more of the plurality of MRAM cells may be located at a point along the write line, which may be indicative of the approximate location of the external magnetic field relative to respective MRAM cell. Similarly, the one or more of the plurality of MRAM cells may be concentrated, or otherwise grouped in a region along the write line, e.g., the one or more of the plurality of MRAM cells may include two or more MRAM cells that are adjacent along the write line. Such a grouping may be indicative of the approximate location (and, e.g., a range or a "span" over distance) of the external magnetic field relative to the plurality of MRAM cells, and to the MRAM module generally.

Additionally, in the above-described examples, the plurality of MRAM cells may be arranged within the MRAM module along the write line so as to cover a particular range, or a distance, within the MRAM module, wherein each of the plurality of MRAM cells is placed along the write line fine increments of distance. As a result, the approximate location of the external magnetic field within this range or distance relative to the plurality of MRAM cells may be determined with a high degree of accuracy.

Once again, the above-described techniques may be performed for various magnitudes and polarities of the write current. In this manner, the control module may determine the presence of the external magnetic field incident upon the plurality of MRAM cells (440) for the particular magnitude and/or polarity of the write current, and proceed to determine the location of each of the plurality of MRAM cells for which the magnetic state has changed (444), and determine the approximate location of the external magnetic field based on the determined location (446), as described above. Finally, the control module may further output one or more output signal(s) indicative of the determined location of the external magnetic field (448).

In other examples consistent with the techniques of this disclosure, the magnetic field sensing system including the MRAM module comprising the plurality of MRAM cells, as illustrated in the examples of each of FIGS. 9 and 10, may be configured to determine presence, magnitude, and polarity of multiple external magnetic fields (e.g., multiple external magnetic fields of varying magnitudes and/or polarities) incident upon the plurality of MRAM cells.

As explained above, in the examples of FIGS. 4-10, the control module may output one or more output signal(s) (e.g., control module output signal(s) 116) indicative of the determined presence, characteristic (i.e., the magnitude and/or the polarity), and location of the external magnetic field. In these examples, the control module may output the one or more output signal(s) in response to an interrogation signal, or the control module may initiate the output of the one or more output signal(s). Furthermore, the control module may output the one or more output signal(s) described above, and/or store the one or more output signal(s) in one or more memories, or memory devices (e.g., one or more MRAM cells of MRAM module 202 used for data storage, as opposed to magnetic field sensing), described above with reference to system 100 of FIG. 1. For example, the one or more output signal(s), whether represented as a single signal, or a plurality of signals, may comprise one or more analog signals, one or more digital signals, or any combination thereof.

In this manner, the method of each of FIG. 4-10 represents an example of a method of sensing a magnetic field, the method comprising providing a write current through a write line associated with an MRAM cell so as to induce a write magnetic field proximate to the MRAM cell, wherein the write magnetic field has a magnitude that is less than a magnetic switching threshold of the MRAM cell, determining a magnetic state of the MRAM cell after initiating the provision of the write current through the write line, and determining a presence of an external magnetic field incident upon the MRAM cell based at least in part on the magnetic state of the MRAM cell.

The techniques of the example methods of FIGS. 4-10 may be used to detect presence, magnitude, and polarity of magnetic fields, such as external magnetic fields, which may be generated by sources external to the magnetic field sensing system. For example, during shipment of a device, system, container, or the like, including system 100 or 300, control module 104 or 304 may periodically provide one or more write control signals to the respective one of MRAM modules 102, 302 to sense one or more magnetic fields and determine various properties thereof, using one or more read signals. This may enable system 100 or 300 to detect tampering with the device, system, or container in which system 100 or 300 is included, or otherwise determine if the device, system, or container has been exposed to magnetic fields having magnitudes greater than or equal to a threshold magnitude which the system 100 or 200 is configured to sense (e.g., based on properties of write current(s) and magnetic switching threshold(s) of one or more MRAM cells included within the respective one of MRAM modules 102, 302). Detecting exposure of a device, system, or container to a particular external magnetic field may help determine whether the integrity of the device, system, or products within the container may have been compromised, e.g., due to tampering or due to changes to the device, system, or products within the container, that may incidentally occur due to exposure to external magnetic fields.

Example applications of the magnetic field sensing techniques of this disclosure include, but are not limited to, detecting and buffering external magnetic field disturbances to a device or system (e.g., disturbances from stray magnetic fields, or from purposefully applied magnetic fields), and detecting and buffering exposures of the device or system to external magnetic fields. As one example, during transport of a device, the device may be exposed to stray magnetic fields. In this example, the exposure of the device to the stray magnetic fields may corrupt, or otherwise compromise data stored within the device, or within one or more components of the device. As another example, a device may be interrogated using purposefully applied magnetic fields, e.g., so as to characterize the device in some manner, or to damage the device. In this example, the characterization or damaging of the device may expose proprietary data stored within the device, or destroy the device itself.

The techniques of this disclosure may prevent or reduce the likelihood of the above-described adverse effects of exposure to magnetic fields by enabling the magnetic field sensing system including the control module and the MRAM module, as described above, to sense magnetic fields, and, in particular, to determine one or more of presence, magnitude, and polarity of magnetic fields, using an MRAM cell (e.g., one or more MRAM cells included within the MRAM module). For example, the techniques described herein may enable notifying a user of a system or a device that includes the magnetic field sensing system of this disclosure that the system or device has been exposed to an external magnetic field, as well as indicating one or more of a magnitude and a polarity of the external magnetic field, to the user. In contrast to other magnetic field sensing devices, systems, and techniques, e.g., those using MR or Hall-Effect technologies previously described, the devices, systems, and techniques of this disclosure may enable sensing magnetic fields, and, more specifically, determining any of the above-described properties of magnetic fields, using one or more MRAM cells. Additionally, as described above, the techniques of this disclosure may be used as part of systems and methods for protecting the integrity of data stored within devices, including MRAM devices, as well as to provide device tamper protection of the devices.

The techniques of this disclosure may be implemented in a wide variety of computer devices. Any components, units, or modules that have been described are provided to emphasize functional aspects, and do not necessarily require realization by different components, units, or modules. The techniques described herein may also be implemented in hardware, software, firmware, or any combination thereof. Any features described as modules, units, or components may be implemented together in an integrated logic device, or separately as discrete but interoperable logic devices. In some cases, various features may be implemented as an integrated circuit (IC) device, such as an IC chip, or chipset.

If any aspects of the techniques are implemented in software, the techniques may be realized at least in part by a computer-readable storage medium comprising instructions that, when executed in a processor, perform one or more of the methods described above. The computer-readable storage medium may comprise a tangible, or non-transitory, computer-readable storage medium, and may form part of a larger product. The computer-readable storage medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic (e.g., MRAM) or optical data storage media, and the like. The computer-readable storage medium may also comprise a non-volatile storage device, such as a hard-disk, magnetic tape, a compact disc (CD), a digital versatile disc (DVD), a Blu-ray disc, holographic data storage media, or other non-volatile storage device.

The memory, or memory devices, described herein, which may be used as part of the described techniques, may also be realized in any of a wide variety of memory, or memory devices, including but not limited to, RAM, SDRAM, NVRAM, EEPROM, FLASH memory, dynamic RAM (DRAM), magnetic RAM (MRAM), or other types of memory.

The term "processor" as used herein may refer to any of the foregoing structure or any other structure suitable for implementation of the techniques described herein, in addition, in some aspects, the functionality described herein may be provided within dedicated software modules or hardware modules configured for performing the techniques of this disclosure. Even if implemented in software, the techniques may use hardware such as a processor to execute the software, and a memory, or memory device, to store the software, in any such cases, the computers described herein may define a specific machine that is capable of executing the specific functions described herein. Also, the techniques could be fully implemented in one or more circuits or logic elements, which could also be considered a processor.

Various examples have been described. These and other examples are within the scope of the following claims.

What is claimed is:

1. A system comprising:
a plurality of magnetoresistive random access memory (MRAM) cells, each MRAM cell comprising a respective magnetic switching threshold;
a write line associated with the plurality of MRAM cells and configured to conduct a write current so as to induce a write magnetic field proximate to the plurality of MRAM cells, wherein the write magnetic field has a magnitude that is less than the magnetic switching thresholds of the MRAM cells;
a write current source;
a switching element electrically connected in series with the write line and configured to provide the write current front the write current source; and
a control module configured to:
control at least one of the write current source or the switching element to provide the write current from the write current source through the write line, such that the magnitude of the write magnetic field is less than the magnetic switching thresholds of the plurality of MRAM cells,
after the provision of the write current through the write line by the write current source is initiated, determine magnetic states of each of the MRAM cells of the plurality, and
determine an approximate location of an external magnetic field relative to the plurality of MRAM cells based at least in part on the magnetic states of the MRAM cells.

2. The system of claim 1, wherein the MRAM cells of the plurality of MRAM cells have substantially the same magnetic switching threshold.

3. The system of claim 1, wherein at least two MRAM cells of the plurality of MRAM cells have different magnetic switching thresholds.

4. The system of claim 1, wherein the control module is configured to determine locations of the MRAM cells that switched magnetic states after initiation of the provision of the write current through the write line and determine the approximate location of the external magnetic field based in part on the locations of the MRAM cells that switched magnetic states.

5. The system of claim 1, wherein the control module is configured to detect a presence of the external magnetic field based at least in part on the determined magnetic state of at least one MRAM cell of the plurality of MRAM cells.

6. The system of claim 1, wherein the control module is further configured to determine a characteristic of the external magnetic field based at least in part on the determined magnetic state of at least one MRAM cell of the plurality of MRAM cells.

7. The system of claim 6, wherein the characteristic comprises a polarity of the external magnetic field, and wherein the control module is configured to determine the polarity of the external magnetic field based at least in part on a polarity of the write current.

8. The system of claim 6, wherein the magnitude of the write magnetic field comprises a first magnitude that is proportional to a second magnitude of the write current, wherein the characteristic comprises a third magnitude of the external magnetic field, and wherein the control module is configured to determine the third magnitude based at least in part on the second magnitude of the write current and the magnetic switching threshold of at least one MRAM cell of the plurality.

9. The system of claim 1, wherein the magnetic switching threshold of each of the MRAM cells corresponds to a minimum magnitude of a magnetic field incident upon the respective MRAM cell that is required to change a magnetic state of the MRAM cell.

10. The system of claim 1, wherein the magnetic state of each MRAM cell of the plurality of MRAM cells correspond to a resistance of the respective MRAM cell, and wherein the control module is configured to determine the magnetic states of the MRAM cells based on the resistances of the MRAM cells.

11. The system of claim 1, wherein the magnetic state of each MRAM cell of the plurality of MRAM cells comprises a current magnetic state of the respective MRAM cell, and wherein the control module is further configured to:
prior to controlling the at least one of the write current source or the switching element to provide the write current, determine an initial magnetic state of each of the MRAM cells of the plurality of MRAM cells, and
wherein to determine the current magnetic states of the MRAM cells, the control module is configured to determine changes in the initial magnetic states of the MRAM cells.

12. A method of sensing a magnetic field, the method comprising:
providing a write current through a write line associated with a plurality of magnetoresistive random access memory (MRAM) cells so as to induce a write magnetic field proximate to the plurality of MRAM cells, each MRAM cell of the plurality comprising a respective magnetic switching threshold, wherein the write magnetic field has a magnitude that is less than the magnetic switching thresholds of the MRAM cells;
determining magnetic states of the MRAM cells of the plurality after the provision of the write current through the write line is initiated; and
determining an approximate location of an external magnetic field relative to the plurality of MRAM cells based at least in part on the magnetic states of the MRAM cells.

13. The method of claim 12, wherein the MRAM cells of the plurality of MRAM cells have substantially the same magnetic switching threshold.

14. The method of claim 12, wherein at least two MRAM cells of the plurality of MRAM cells have different magnetic switching thresholds.

15. The method of claim 12, wherein determining the approximate location of the external magnetic field comprises:
determining locations of the MRAM cells that switched magnetic states after the provision of the write current through the write line is initiated; and
determining the approximate location of the external magnetic field based in part on the locations of the MRAM cells that switched magnetic states.

16. The method of claim 12, further comprising determining a presence of an external magnetic field incident upon the MRAM cell based at least in part on the determined magnetic state of at least one MRAM cell of the plurality of MRAM cells.

17. The method of claim 12, further comprising determining a characteristic of the external magnetic field based at least in part on the determined magnetic state of at least one MRAM cell of the plurality of MRAM cells.

18. The method of claim 17, wherein determining the characteristic comprises determining a polarity of the external magnetic field based at least in part on a polarity of the write current.

19. The method of claim 17, wherein the magnitude comprises a first magnitude that is proportional to a second magnitude of the write current, and wherein determining the characteristic comprises determining a third magnitude of the external magnetic field based at least in part on the second magnitude of the write current and the magnetic switching threshold of the MRAM cell.

20. A magnetic field sensing device comprising:
means for providing a write current through a write line associated with a plurality of magnetoresistive random access memory (MRAM) cells so as to induce a write magnetic field proximate to the plurality of MRAM cells, each MRAM cell of the plurality comprising a respective magnetic switching threshold, wherein the write magnetic field has a magnitude that is less than the magnetic switching thresholds of the MRAM cells;
means for determining magnetic states of the MRAM cells of the plurality after the provision of the write current through the write line is initiated; and
means for determining an approximate location of an external magnetic field relative to the plurality of MRAM cells based at least in part on the magnetic states of the MRAM cells.

\* \* \* \* \*